(12) United States Patent
Ogawa et al.

(10) Patent No.: US 12,295,176 B2
(45) Date of Patent: May 6, 2025

(54) ELECTROMAGNETIC WAVE DETECTOR AND ELECTROMAGNETIC WAVE DETECTOR ASSEMBLY

(71) Applicant: Mitsubishi Electric Corporation, Tokyo (JP)

(72) Inventors: Shimpei Ogawa, Tokyo (JP); Masaaki Shimatani, Tokyo (JP); Shoichiro Fukushima, Tokyo (JP); Satoshi Okuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 354 days.

(21) Appl. No.: 17/919,323

(22) PCT Filed: Mar. 10, 2021

(86) PCT No.: PCT/JP2021/009596
§ 371 (c)(1),
(2) Date: Feb. 24, 2023

(87) PCT Pub. No.: WO2021/256018
PCT Pub. Date: Dec. 23, 2021

(65) Prior Publication Data
US 2023/0282759 A1    Sep. 7, 2023

(30) Foreign Application Priority Data
Jun. 17, 2020    (JP) ................. 2020-104531

(51) Int. Cl.
*H10F 30/227*    (2025.01)
*H10F 77/122*    (2025.01)
*G01J 1/02*    (2006.01)

(52) U.S. Cl.
CPC ......... *H10F 30/227* (2025.01); *H10F 77/122* (2025.01); *G01J 1/0204* (2013.01)

(58) Field of Classification Search
CPC ..... H10F 30/227; H10F 77/122; G01J 1/0204
See application file for complete search history.

(56) References Cited

U.S. PATENT DOCUMENTS

2014/0264275 A1 * 9/2014 Zhong ................. H10F 77/1433
                                                     257/21
2015/0243826 A1    8/2015 An et al.
(Continued)

FOREIGN PATENT DOCUMENTS

| JP | 2016-25356 A | 2/2016 |
| WO | 2019/171622 A1 | 9/2019 |
| WO | 2020/003613 A1 | 1/2020 |

OTHER PUBLICATIONS

International Search Report and Written Opinion mailed on Jun. 1, 2021, received for PCT Application PCT/JP2021/009596, filed on Mar. 10, 2021, 13 pages including English Translation.

*Primary Examiner* — Dani Fox
*Assistant Examiner* — Fani Polyzos Boosalis
(74) *Attorney, Agent, or Firm* — XSENSUS LLP

(57) ABSTRACT

Electromagnetic wave detector includes semiconductor layer, first insulating film, two-dimensional material layer, first electrode, second electrode, second insulating film, and control electrode. First insulating film is arranged on semiconductor layer. First insulating film is provided with opening. Two-dimensional material layer is electrically connected to semiconductor layer in opening. Two-dimensional material layer extends from above opening to first insulating film. Second insulating film is in contact with two-dimensional material layer. Control electrode is connected to two-dimensional material layer with second insulating film interposed therebetween.

24 Claims, 38 Drawing Sheets

(56) References Cited

U.S. PATENT DOCUMENTS

| | | |
|---|---|---|
| 2016/0020280 A1 | 1/2016 | Heo et al. |
| 2017/0256667 A1 | 9/2017 | Lee et al. |
| 2020/0052146 A1* | 2/2020 | Ogawa .................. G01J 5/0881 |
| 2020/0395499 A1 | 12/2020 | Ogawa et al. |
| 2021/0020797 A1 | 1/2021 | Fukushima et al. |

* cited by examiner

ELECTROMAGNETIC WAVE DETECTOR AND ELECTROMAGNETIC WAVE DETECTOR ASSEMBLY

CROSS-REFERENCE TO RELATED APPLICATIONS

The present application is based on PCT filing PCT/JP2021/009596, filed Mar. 10, 2021, which claims priority to Japanese Patent Application 2020-104531, filed Jun. 17, 2020, the entire contents of each of which is incorporated herein by reference.

TECHNICAL FIELD

The present disclosure relates to an electromagnetic wave detector and an electromagnetic wave detector assembly.

BACKGROUND ART

As a material of an electromagnetic wave detecting layer for use in a next-generation electromagnetic wave detector, graphene which is one example of a two-dimensional material layer is known. Graphene has very high mobility. Absorptance of graphene is as low as 2.3%. For this reason, a technique of enhancing the sensitivity in an electromagnetic wave detector in which graphene is used as a two-dimensional material layer has been proposed.

For example, U.S. Patent Application Publication 2015/0243826 proposes a detector having the following structure. That, in U.S. Patent Application Publication 2015/0243826, two or more dielectric layers are disposed on the n-type semiconductor layer. A graphene layer is formed on two dielectric layers, and on a surface part of an n-type semiconductor layer located between the two dielectric layers. Source and drain electrodes connected to both ends of the graphene layer are arranged on the dielectric layer. The gate electrode is connected to the n-type semiconductor layer.

In the aforementioned detector, voltage is applied to the graphene layer serving as a channel via the source and drain electrodes. As a result, the photo carrier generated in the n-type semiconductor layer is amplified, and thus the sensitivity of the detector improves. When voltage is applied to the gate electrode, and the source electrode or the drain electrode, OFF operation is enabled by Schottky connection between graphene and the n-type semiconductor layer. The aforementioned detector detects an electromagnetic wave having a large energy that is greater than or equal to the difference between the Fermi level of the graphene layer and the Fermi level of the n-type semiconductor layer being in contact with the graphene layer.

CITATION LIST

Patent Literature

PTL 1: U.S. Patent Application Publication 2015/0243826

SUMMARY OF INVENTION

Technical Problem

In the detector (electromagnetic wave detector) described in the above publication, the Fermi level of the graphene layer (two-dimensional material layer) cannot be varied from the Fermi level at the point of time when the graphene layer is formed. Therefore, an appropriate Schottky barrier is not formed, for example, depending on the deposition condition of the graphene layer. Therefore, the detector sometimes fails to detect an electromagnetic wave which is a detection target of the detector.

The present disclosure was made in light of the above problems, and it is an object of the present disclosure to provide an electromagnetic wave detector and an electromagnetic wave detector assembly capable of varying a Fermi level of a two-dimensional material layer.

Solution to Problem

An electromagnetic wave detector of the present disclosure includes a semiconductor layer, a first insulating film, a two-dimensional material layer, a first electrode, a second electrode, a second insulating film, and a control electrode. The first insulating film is arranged on the semiconductor layer. In the first insulating film, an opening is formed. The two-dimensional material layer is electrically connected to the semiconductor layer in the opening. The two-dimensional material layer extends from above the opening to the first insulating film. The first electrode is electrically connected to the two-dimensional material layer. The second electrode is electrically connected to the semiconductor layer. The second insulating film is in contact with the two-dimensional material layer. The control electrode is connected to the two-dimensional material layer with the second insulating film interposed therebetween.

Advantageous Effects of Invention

According to the electromagnetic wave detector of the present disclosure, it is possible to vary the Fermi level of the two-dimensional material layer.

DESCRIPTION OF EMBODIMENTS

Figure 1:
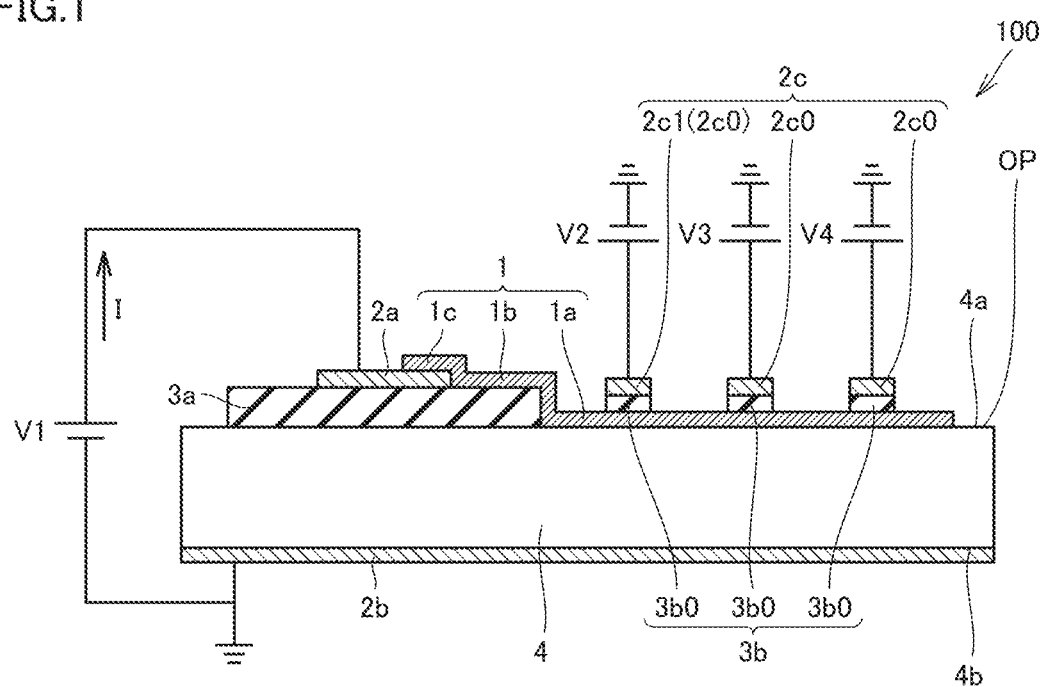
FIG. 1 is a section view schematically showing a first configuration of an electromagnetic wave detector according to Embodiment 1.

Hereinafter, embodiments are described with reference to the drawings. In the following, the same or the corresponding part 1s denoted by the same reference numeral and overlapping description is not repeated.

In the embodiments described below, the drawings are schematic, and conceptually illustrate the functions or structures. The embodiments described below will not restrict the present disclosure. The basic structure of the electromagnetic wave detector is common among all of the embodiments unless otherwise noted. The one denoted by the same reference numeral corresponds to the same object or a corresponding object as described above. This applies in the entirety of the description.

In the embodiments described below, configuration of an electromagnetic wave detector in the case of detecting visible light or infrared light is described, however, the light to be detected by the electromagnetic wave detector of the present disclosure is not limited to visible light and infrared light. The embodiments described below are effective as detectors that detect, for example, X-ray, ultraviolet light, far red light, terahertz (THz) wave, radio waves such as microwave, as well as visible light and infrared light. In the embodiments of the present disclosure, these light and radio waves are collectively referred to as an electromagnetic wave.

Also, in the present embodiments, graphene can be described by the terms of p-type graphene and n-type graphene. In the following embodiments, the graphene having more holes than intrinsic graphene is called p-type graphene, and the graphene having more electrons than intrinsic graphene is called n-type graphene.

Also, when polarization is observed in electric charges in the entire molecule, the one in which electrons are dominant is sometimes called n-type. When polarization is observed in electric charges in the entire molecule, the one in which holes are dominant is sometimes called p-type. As a material of the member that comes into contact with graphene which is one example of the two-dimensional material layer, one of an organic substance or an inorganic substance, or a mixture of an organic substance and an inorganic substance may be used.

Regarding plasmon resonance phenomena such as a surface plasmon resonance phenomenon that is the interaction between the metal surface and the light, a phenomenon called a pseudo surface plasmon resonance phenomenon in the meaning of resonance concerning metal surface outside the visible light range and near-infrared range, or a phenomenon called a metamaterial or a plasmonic metamaterial in the meaning of manipulating the wavelength by a structure having a dimension of less than or equal to the wavelength, these are not particularly distinguished from each other according to the names, but are equally handled from the aspect the effect exerted by the phenomenon. Here, these resonances are called, surface plasmon resonance, plasmon resonance, or simply resonance.

In the embodiments described below, description is made for graphene as an example of a material of the two-dimensional material layer, however, the material of the two-dimensional material layer is not limited to graphene. For example, as a material of the two-dimensional material layer, materials such as transition metal dichalcogenide (TMD), black phosphorus, silicene (two-dimensional honeycomb structure by silicon atoms), germanene (two-dimensional honeycomb structure by germanium atoms) and the like are applicable. Examples of transition metal dichalcogenide include transition metal dichalcogenide such as molybdenum disulfide ($MoS_2$), tungsten disulfide ($WS_2$), tungsten diselenide ($WSe_2$) and the like.

These materials have structures similar to those of graphene. In these materials, atoms are arranged by a monolayer in the two-dimensional surface. Therefore, when these materials are applied to the two-dimensional material layer, the operation and effect similar to those in the case of applying graphene to the two-dimensional material layer are obtained.

In the present embodiments, the object represented by insulating layer is a layer of an insulator having such a thickness that will not generate a tunnel current. The object represented by barrier layer is a layer of an insulator having such a thickness that generates a tunnel current.

Embodiment 1

<Configuration of Electromagnetic Wave Detector 100>

Referring to FIGS. 1 to 5, a configuration of an electromagnetic wave detector 100 according to Embodiment 1 is described.

As shown in FIG. 1, electromagnetic wave detector 100 includes a two-dimensional material layer 1, a first electrode 2a, a second electrode 2b, a control electrode 2c, a first insulating film 3a, a second insulating film 3b, and a semiconductor layer 4.

First insulating film 3a is arranged on semiconductor layer 4. First insulating film 3a is provided with an opening OP. In the present embodiment, semiconductor layer 4 is exposed from first insulating film 3a in opening OP. Therefore, an electromagnetic wave is applied to semiconductor layer 4 through opening OP. The shape of first insulating film 3a may be appropriately determined as long as opening OP is provided. The shape of opening OP may be appropriately determined as long as semiconductor layer 4 is exposed from first insulating film 3a. It suffices that at least one of two-dimensional material layer 1 and semiconductor layer 4 is exposed from opening OP. Therefore, it suffices that the electromagnetic wave is applied to two-dimensional material layer 1 and semiconductor layer 4 through opening OP.

Figure 2:
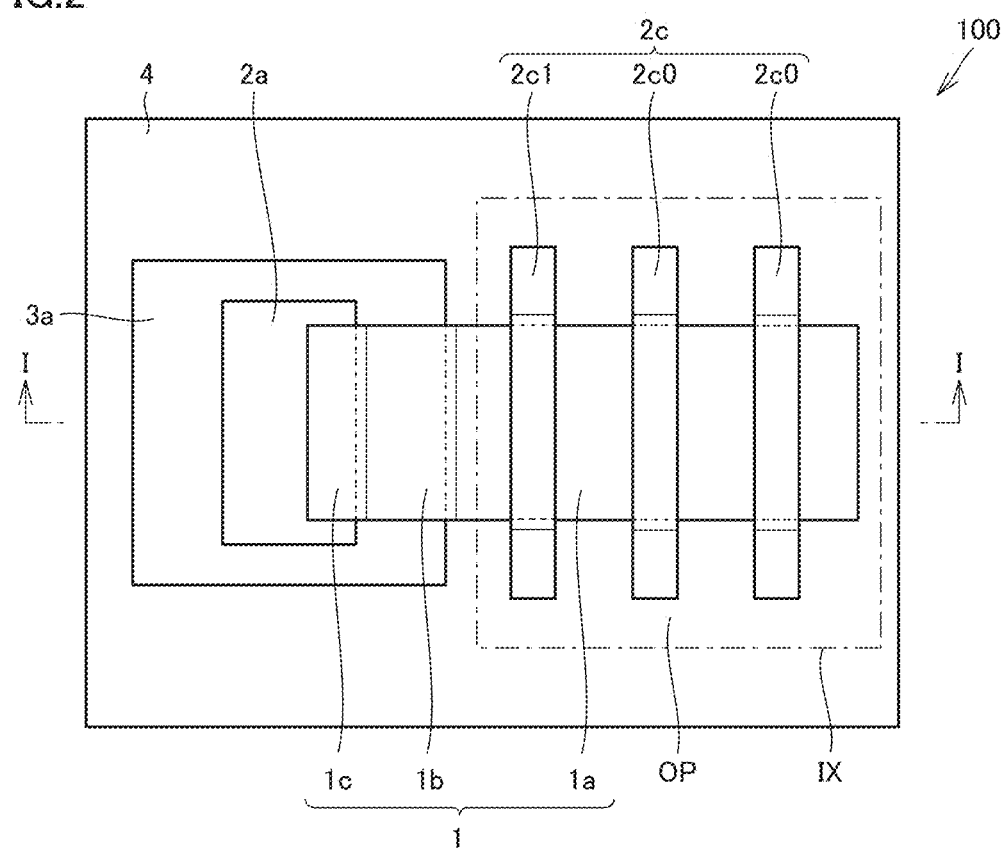
FIG. 2 is a top view schematically showing the first configuration of the electromagnetic wave detector according to Embodiment 1.
Figure 3:
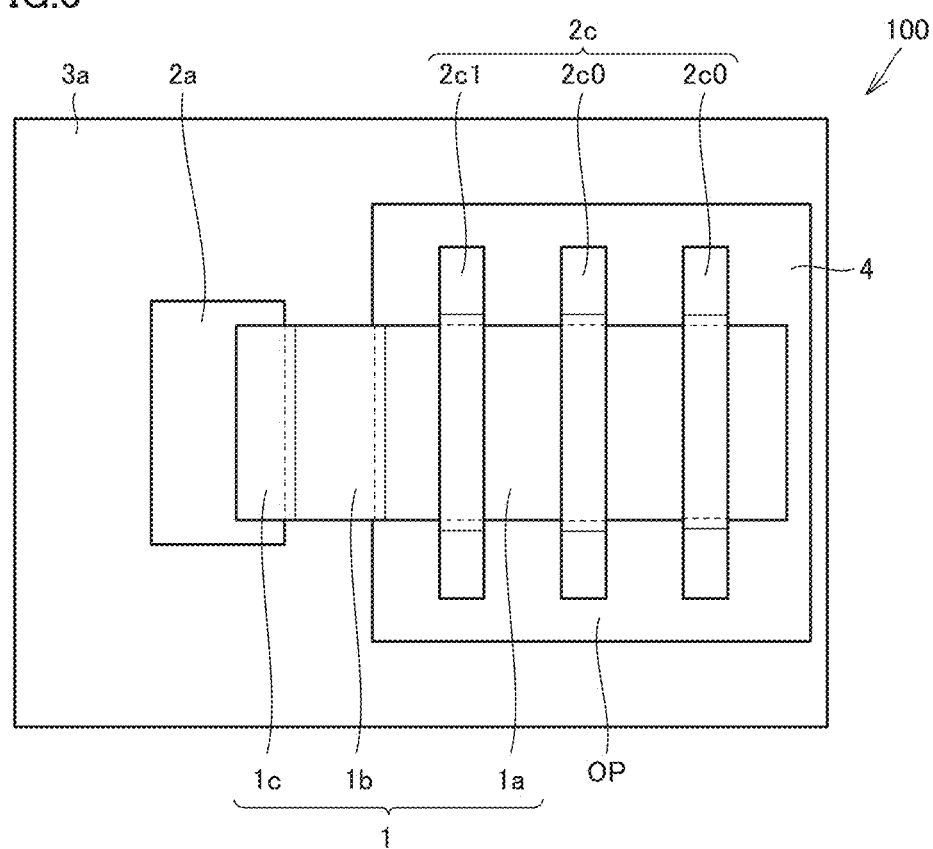
FIG. 3 is a top view schematically showing a second configuration of the electromagnetic wave detector according to Embodiment 1.
Figure 4:
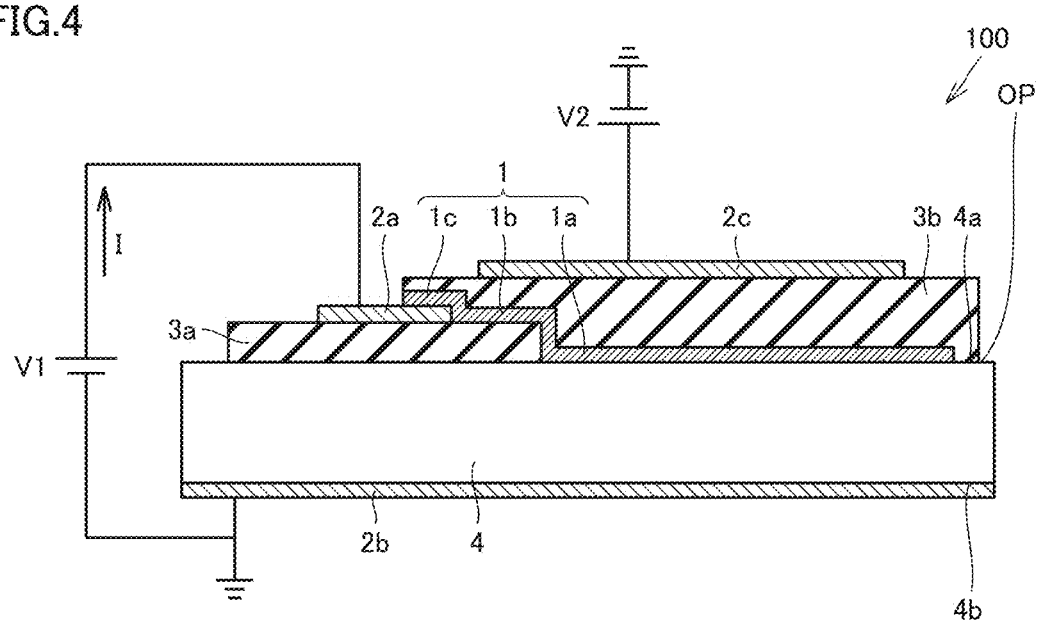
FIG. 4 is a section view schematically showing a third configuration of the electromagnetic wave detector according to Embodiment 1.

As shown in FIG. 2, the shape of first insulating film 3a may be a shape surrounded by opening OP. Also, as shown in FIG. 3, the shape of first insulating film 3a may be a shape surrounding opening OP. As shown in FIG. 4, first insulating film 3a may have such a shape that covers entire two-dimensional material layer 1.

As shown in FIG. 1, two-dimensional material layer 1 is electrically connected to semiconductor layer 4 in opening OP. Two-dimensional material layer 1 extends from above opening OP to first insulating film 3a. Two-dimensional material layer 1 contains any one of materials selected from the group consisting of graphene, transition metal dichalcogenide (TMD), black phosphorus, silicene (two-dimensional honeycomb structure by silicon atoms), graphene nanoribbon, and borophene. In the present embodiment, the material of two-dimensional material layer 1 contains later-described graphene. The material of two-dimensional material layer 1 is desirably a material that generates surface plasmon resonance.

Two-dimensional material layer 1 includes a first part 1a, a second part 1b and a third part 1c. In the present embodiment, first part 1a is directly connected to semiconductor layer 4. First part 1a is arranged inside opening OP. The electromagnetic wave applied to electromagnetic wave detector 100 enters semiconductor layer 4 through first part 1a. In the present embodiment, second part 1b is arranged on first insulating film 3a. As described later, a gap may be provided between second part 1b and first insulating film 3a. Third part 1c is electrically connected to first electrode 2a. While third part 1c is arranged on first electrode 2a in FIG. 1, third part 1c may be appropriately arranged as long as it is electrically connected to first electrode 2a.

First electrode 2a is arranged on first insulating film 3a. First electrode 2a is connected to semiconductor layer 4 with first insulating film 3a interposed therebetween. First electrode 2a is electrically connected to two-dimensional material layer 1. First electrode 2a may be directly connected to two-dimensional material layer 1.

Second electrode 2b is electrically connected to semiconductor layer 4. Second electrode 2b may be directly connected to semiconductor layer 4. Electromagnetic wave detector 100 is configured to vary the voltage difference between first electrode 2a and second electrode 2b. For this, electromagnetic wave detector 100 is configured such that a bias voltage V1 is applied to two-dimensional material layer 1, first insulating film 3a and semiconductor layer 4 arranged between first electrode 2a and second electrode 2b.

Second insulating film 3b is in contact with two-dimensional material layer 1. Second insulating film 3b may be directly connected to two-dimensional material layer 1. In the present embodiment, second insulating film 3b and semiconductor layer 4 sandwich two-dimensional material layer 1. Second insulating film 3b is arranged on two-dimensional material layer 1.

Control electrode 2c is connected to two-dimensional material layer 1 with second insulating film 3b interposed therebetween. In the present embodiment, control electrode 2c and two-dimensional material layer 1 sandwich second insulating film 3b. Control electrode 2c is arranged on second insulating film 3b. Electromagnetic wave detector 100 is configured to apply voltage to two-dimensional material layer 1 by control electrode 2c. Specifically, electromagnetic wave detector 100 is configured to vary the Fermi level of two-dimensional material layer 1 by applying voltage to two-dimensional material layer 1 by control electrode 2c.

In the present embodiment, control electrode 2c includes a plurality of control electrode parts 2c0. Plurality of control electrode parts 2c0 include a first control electrode part 2c1.

First control electrode part 2c1 is connected to first part 1a with second insulating film 3b interposed therebetween. When control electrode 2c includes plurality of control electrode parts 2c0, second insulating film 3b may include a plurality of second insulating film parts 3b0. Each of plurality of control electrode parts 2c0 is respectively connected to semiconductor layer 4 with each of plurality of second insulating film parts 3b0 interposed therebetween.

Figure 5:
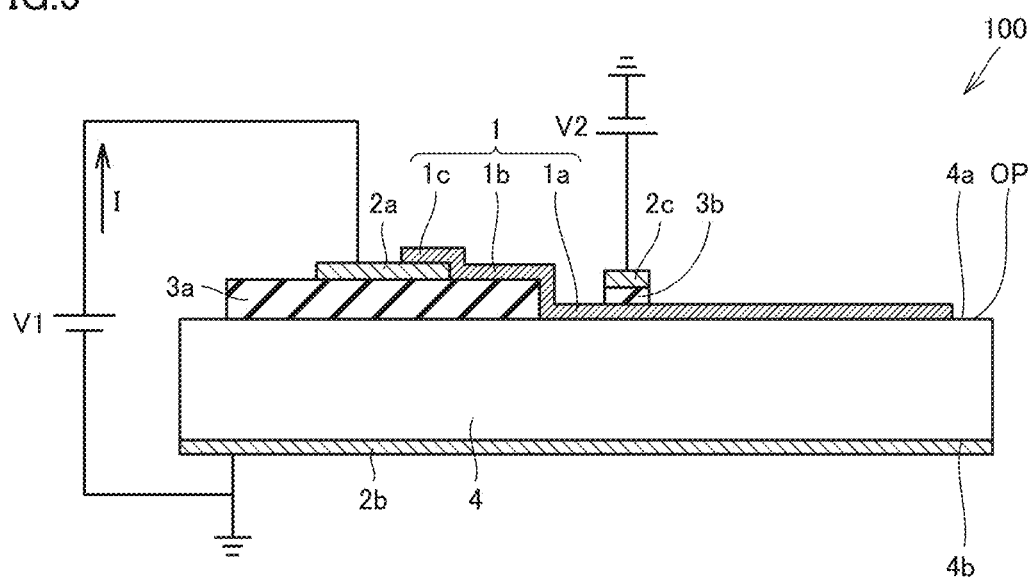
FIG. 5 is a section view schematically showing a fourth configuration of the electromagnetic wave detector according to Embodiment 1.

The number and positions of plurality of control electrode parts 2c0 may be appropriately determined as long as control electrode 2c is connected to two-dimensional material layer 1 with second insulating film 3b interposed therebetween. Further, as shown in FIG. 5, control electrode 2c may be a single electrode. Even when control electrode 2c is a single electrode, the Fermi level of two-dimensional material layer 1 is controlled by voltage.

As shown in FIG. 1, semiconductor layer 4 includes a first surface 4a and a second surface 4b. Second surface 4b is opposed to first surface 4a. Two-dimensional material layer 1 and first insulating film 3a are arranged on first surface 4a. Electromagnetic wave is applied on first surface 4a side of semiconductor layer 4. Second electrode 2b may be arranged on second surface 4b.

Semiconductor layer 4 has sensitivity in a detection wavelength. In the present embodiment, the detection wavelength refers to a range of wavelengths possessed by electromagnetic waves to be detected by electromagnetic wave detector 100. The detection wavelength is determined in advance. Semiconductor layer 4 is configured such that a photo carrier is generated in semiconductor layer 4 by application of an electromagnetic wave having the detection wavelength to semiconductor layer 4. In the present embodiment, the phenomenon that a photo carrier is generated by application of an electromagnetic wave is called photoelectric conversion. A semiconductor material that forms semiconductor layer 4 may be appropriately determined according to the detection wavelength.

The Fermi level of semiconductor layer 4 is different from the Fermi level of two-dimensional material layer 1. The Fermi level of two-dimensional material layer 1 is the energy capable of forming a Schottky barrier between two-dimensional material layer 1 and semiconductor layer 4. Accordingly, a Schottky barrier is formed between two-dimensional material layer 1 and semiconductor layer 4. Therefore, two-dimensional material layer 1 and semiconductor layer 4 are formed to function as a diode by a Schottky barrier.

Electromagnetic wave detector 100 further includes an unillustrated first power circuit, and an unillustrated second power circuit. Electromagnetic wave detector 100 may further include an unillustrated ammeter. The first power circuit is configured such that bias voltage V1 is applied to first insulating film 3a and semiconductor layer 4 via first electrode 2a and second electrode 2b. Electromagnetic wave detector 100 is configured such that voltage difference between first electrode 2a and second electrode 2b is varied by the first power circuit.

The second power circuit is configured such that a control voltage V2 is applied to two-dimensional material layer 1 via control electrode 2c. Control voltage V2 is a voltage for controlling the Fermi level of two-dimensional material layer 1. Electromagnetic wave detector 100 is configured such that the Fermi level of two-dimensional material layer 1 is varied by applying voltage to two-dimensional material layer 1 via control electrode 2c by the second power circuit.

When control electrode 2c includes a plurality of control electrode parts 2c0, electromagnetic wave detector 100 may include a plurality of second power circuits. Each of the plurality of second power circuits may be respectively connected to each of plurality of control electrode parts 2c0. For example, the three second power circuits each may respectively apply control voltages V2, V3, V4 that are different from each other to each of three control electrode parts 2c0.

Application of control voltage V2 to two-dimensional material layer 1 results in variation in the Fermi level of two-dimensional material layer 1. Accordingly, assuming that the Fermi level of two-dimensional material layer 1 before variation is such an energy that cannot form a Schottky barrier together with semiconductor layer 4, the Fermi level of two-dimensional material layer 1 varies to such an energy that can form a Schottky barrier together with semiconductor layer 4.

The ammeter is electrically connected to the first power circuit. The ammeter is configured to detect a current flowing in two-dimensional material layer 1 between first electrode 2a and second electrode 2b.

<Regarding Schottky Barrier Provided Between Two-Dimensional Material Layer 1 and Semiconductor Layer 4>

Subsequently, with reference to FIGS. 6 and 7, a Schottky barrier formed between two-dimensional material layer 1 and semiconductor layer 4 is described.

Figure 6:
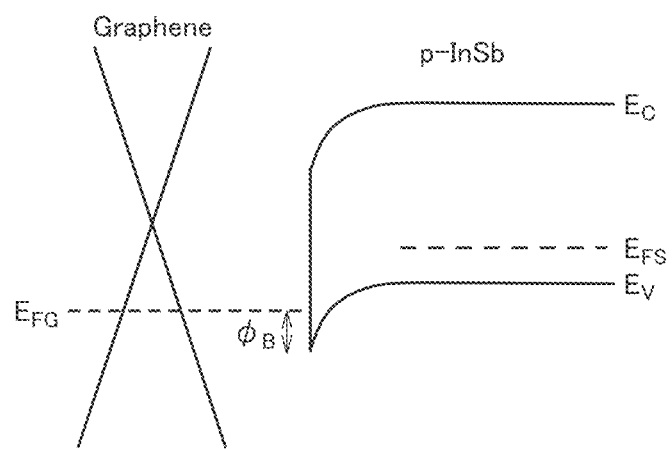
FIG. 6 is a band diagram schematically showing the Fermi level of a two-dimensional material layer and the Fermi level of a semiconductor layer in a state that a Schottky barrier is formed.
Figure 7:
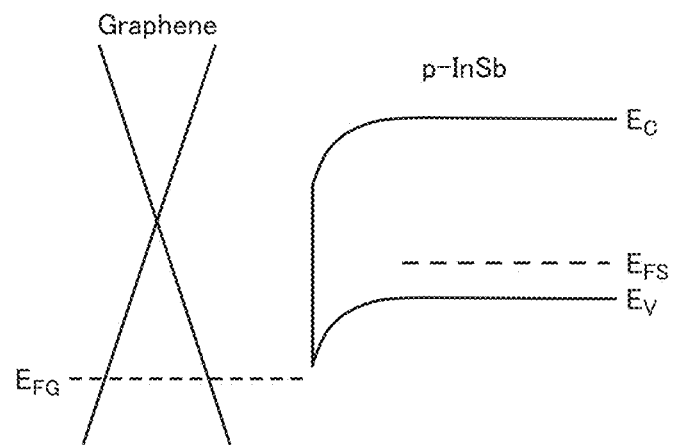
FIG. 7 is a band diagram schematically showing the Fermi level of the two-dimensional material layer and the Fermi level of the semiconductor layer in a state that a Schottky barrier is not formed.

FIGS. 6 and 7 are band diagrams when the material of two-dimensional material layer 1 is graphene, and semiconductor layer 4 is indium antimonide (InSb). FIG. 6 is a band diagram in the state that a Schottky barrier is formed. FIG. 7 is a band diagram in the state that a Schottky barrier is not formed. The conductive type of semiconductor layer 4 is a p type. The photo carrier is electron. $\phi_B$ indicates a Schottky barrier. $E_{FG}$ indicates a Fermi level of two-dimensional material layer 1. $E_{FS}$ indicates a Fermi level of semiconductor layer 4. $E_C$ indicates a conduction band of semiconductor layer 4. $E_V$ indicates a valence band of semiconductor layer 4.

In FIG. 6, the Fermi level of two-dimensional material layer 1 is larger than the lower limit of the valence band of semiconductor layer 4. Accordingly, a Schottky barrier is formed between two-dimensional material layer 1 and semiconductor layer 4. Thus, a diode characteristic is generated between two-dimensional material layer 1 and semiconductor layer 4.

Further, since electromagnetic wave detector 100 is configured to vary the voltage difference between first electrode 2a and a third electrode, voltage is applied to two-dimensional material layer 1 and semiconductor layer 4 so that the photo carrier has an energy exceeding the Schottky barrier. As a result, the photo carrier exceeds the Schottky barrier from two-dimensional material layer 1 to reach semiconductor layer 4.

If the Fermi level of two-dimensional material layer 1 is smaller than the lower limit of the valence band of semiconductor layer 4 as shown in FIG. 7, a Schottky barrier is not formed between two-dimensional material layer 1 and semiconductor layer 4. Thus, a diode characteristic is not generated between two-dimensional material layer 1 and semiconductor layer 4. When a diode characteristic is not generated between two-dimensional material layer 1 and semiconductor layer 4, dark current flowing in two-dimensional material layer 1 increases. Therefore, even if a large detection signal is obtained by the later-described photogating effect, the SN ratio deteriorates.

Also, if the Schottky barrier is small, the proportion of the dark current to the variation in bias voltage V1 increases, so that the operation as electromagnetic wave detector 100 becomes instable. That is, even when bias voltage V1 slightly varies, the dark current increases, and the SN ration deteriorates.

While FIGS. 6 and 7 illustrate the band diagrams in the case where the photo carrier is an electron, and the conductive type of semiconductor layer 4 is a p-type, the photo carrier and the conductive type are not limited to these. In other words, the photo carrier may be any of electron or hole as long as a Schottky barrier is formed between two-dimensional material layer 1 and semiconductor layer 4. The conductive type of semiconductor layer 4 may be any of n-type or p-type as long as a Schottky barrier is formed between two-dimensional material layer 1 and semiconductor layer 4.

Subsequently, configuration of each of two-dimensional material layer 1, first electrode 2a, second electrode 2b, control electrode 2c, first insulating film 3a and semiconductor layer 4 of electromagnetic wave detector 100 according to Embodiment 1 is specifically described.

<Configuration of Two-Dimensional Material Layer 1>

Two-dimensional material layer 1 is, for example, monolayer graphene. Monolayer graphene is a monoatomic layer of two-dimensional carbon crystal. The thickness of monolayer graphene is, for example, 0.34 nm which corresponds to one carbon atom. Also, graphene has a plurality of carbon atoms that are arranged in each of a plurality of chains arranged in a hexagonal form. Absorptance of graphene is as low as 2.3%. Specifically, absorptance of white light of graphene is 2.3%. In the present embodiment, the white light is light in which light having visible light wavelengths are evenly mixed.

Two-dimensional material layer 1 may be multilayer graphene in which a plurality of graphene layers are laminated. The orientations of lattice vector of hexagonal lattices of graphene in multilayer graphene may be coincident or different from each other. The orientations of lattice vector of hexagonal lattices of graphene in multilayer graphene may be perfectly coincident.

For example, by lamination of two or more layers of graphene layers, a band gap is formed in two-dimensional material layer 1. In other words, by varying the number of multilayer graphene layers, it is possible to adjust the size of the band gap. As a result, two-dimensional material layer 1 is capable of having a wavelength selective effect that selects an electromagnetic wave (detection wavelength) that is a target for photoelectric conversion. Also, for example, as the number of graphene layers of multilayer graphene increases, the mobility in the channel region deteriorates. On the other hand, as the number of graphene layers of multilayer graphene increases, the influence of carrier scattering from the substrate is suppressed, so that the noise of electromagnetic wave detector 100 decreases. Therefore, in electromagnetic wave detector 100 having two-dimensional material layer 1 in which multilayer graphene is used, light absorption is increased, and hence the detection sensitivity of electromagnetic wave improves.

Two-dimensional material layer 1 includes a region functioning as a channel region, and regions functioning as source and drain layers. In the present embodiment, first part 1a and third part 1c are regions functioning as source and drain regions. Second part 1b is a region functioning as a channel region.

A material of two-dimensional material layer 1 may be uniform or different in the region functioning as a channel region, and in the regions functioning as source and drain layers.

By contact of third part 1c of two-dimensional material layer 1 with first electrode 2a, the photo carrier is doped from first electrode 2a to two-dimensional material layer 1. For example, when two-dimensional material layer 1 is graphene, and first electrode 2a is gold (Au), the photo carrier is a hole. By the difference between the work function of graphene and the work function of gold (Au), holes are doped to third part 1c that is in contact with first electrode 2a. When electromagnetic wave detector 100 operates in an electron conductive state while third part 1c is doped with holes, the mobility of electrons flowing in the channel deteriorates by the influence of the holes. Therefore, the contact resistance between two-dimensional material layer 1 and first electrode 2a increases. In particular, when all regions in two-dimensional material layer 1 are formed of monolayer graphene, the amount of carrier (dope amount) introduced from first electrode 2a into two-dimensional material layer 1 is large. Therefore, deterioration in mobility of the field effect of electromagnetic wave detector 100 is significant. Therefore, when all regions of two-dimensional material layer 1 are formed of monolayer graphene, the performance of electromagnetic wave detector 100 deteriorates.

The amount of carrier doped to multilayer graphene from first electrode 2a is smaller than the amount of carrier doped to monolayer graphene from first electrode 2a. Therefore, since the source and drain regions where the carrier is easy to be doped (first part 1a and third part 1c) are formed of multilayer graphene, it is possible to suppress the increase in the contact resistance between two-dimensional material layer 1 and first electrode 2a. This makes it possible to suppress the deterioration in mobility of the field effect of electromagnetic wave detector 100, and thus it is possible to improve the performance of electromagnetic wave detector 100.

From the above, preferably, multilayer graphene is used as a material of the source and drain regions (first part 1a and third part 1c). Monolayer graphene is used in the channel region (second part 1b).

Two-dimensional material layer 1 may be undoped graphene. Two-dimensional material layer 1 may be graphene doped with a p-type or n-type impurity.

As two-dimensional material layer 1, nanoribbon-like graphene (graphene nanoribbon) may be used. Two-dimensional material layer 1 may be sole graphene nanoribbon. The structure of two-dimensional material layer 1 may be such a structure that a plurality of graphene nanoribbons are laminated. The structure of two-dimensional material layer 1 may be such a structure that graphene nanoribbons are periodically arranged on a plane. In the case where two-dimensional material layer 1 has such a structure that graphene nanoribbons are periodically arranged, plasmon resonance is generated in the graphene nanoribbons, and hence the sensitivity of electromagnetic wave detector 100 improves. The structure in which graphene nanoribbons are periodically arranged is also called graphene metamaterial.

An unillustrated protective film may be provided on two-dimensional material layer 1. The unillustrated protective film is provided in such a manner to cover two-dimensional material layer 1, first electrode 2a, first insulating film 3a and semiconductor layer 4. The protective film is, for example, an insulating film formed of silicon oxide (SiO).

The protective film may be an insulating film of an oxide or a nitride or the like. The protective film may be, for example, of aluminum oxide (alumina: $Al_2O_3$), or hafnium oxide ($HfO_2$). The protective film may be of boron nitride (BN).

<Configurations of First Electrode 2a, Second Electrode 2b and Control Electrode 2c>

Materials of first electrode 2a, second electrode 2b and control electrode 2c may be any materials as long as they are conductors. Materials of first electrode 2a, second electrode 2b and control electrode 2c may contain at least any one of, for example, gold (Au), silver (Ag), copper (Cu), aluminum (Al), nickel (Ni), chromium (Cr) and palladium (Pd). An unillustrated close adherence layer may be provided between first electrode 2a and first insulating film 3a, between second electrode 2b and semiconductor layer 4, and between control electrode 2c and second insulating film 3b. The close adherence layer is formed to enhance the adherence. The material of close adherence layer includes, for example, metal materials such as chromium (Cr) or titanium (Ti).

<Configurations of First Insulating Film 3a and Second Insulating Film 3b>

First insulating film 3a and second insulating film 3b are, for example, insulating films of silicon oxide (SiN). Materials of first insulating film 3a and second insulating film 3b may be, for example, tetraethyl orthosilicate ($Si(OC_2H_5)_4$), silicon nitride ($Si_3N_4$), hafnium oxide ($HfO_2$), aluminum oxide ($Al_2O_3$), nickel oxide (NiO), boron nitride (BN), and siloxane-based polymer materials. For example, the atomic arrangement of boron nitride (BN) resembles the atomic arrangement of graphene. Therefore, when boron nitride (BN) comes into contact with two-dimensional material layer 1 formed of graphene, deterioration in electron mobility of two-dimensional material layer 1 is suppressed. Therefore, boron nitride (BN) is suited for an insulating film as an underlying film arranged under two-dimensional material layer 1.

Thicknesses of first insulating film 3a and second insulating film 3b are not particularly limited as long as two-dimensional material layer 1, first electrode 2a and second electrode 2b are electrically insulated from semiconductor layer 4, and a tunnel current is not generated between two-dimensional material layer 1, first electrode 2a and second electrode 2b, and semiconductor layer 4.

The smaller the thickness of first insulating film 3a, the larger the degree of field change of two-dimensional material layer 1 by the photo carrier generated in the interface between first insulating film 3a and semiconductor layer 4. Meanwhile, the smaller the thickness of second insulating film 3b, the larger the degree of field change of two-dimensional material layer 1 by the photo carrier generated in the interface between second insulating film 3b and semiconductor layer 4. Therefore, it is desired that the thicknesses of first insulating film 3a and second insulating film 3b are as small as possible. In the present embodiment, filed change of two-dimensional material layer 1 caused by the photo carrier generated in the interface between the insulating film (first insulating film 3a and second insulating film 3b) and semiconductor layer 4 is called photo-gating effect. The detailed process of generation of photo-gating effect is described later.

<Semiconductor Layer 4>

Examples of materials of semiconductor layer 4 include silicon (Si), germanium (Ge), compound semiconductors such as group III-V semiconductors or group II-V semiconductors, cadmium mercury telluride (HgCdTe), iridium antimonide (InSb), lead selenide (PbSe), lead sulfide (PbS), cadmium sulfide (CdS), gallium nitride (GaN), silicon carbide (SiC), gallium phosphide (GaP), indium gallium arsenide (InGaAs), indium arsenide and (InAs). Semiconductor layer 4 may be a substrate including a quantum well or a quantum dot. The material of semiconductor layer 4 may be Type II superlattice. The material of semiconductor layer 4 may be a single material of the aforementioned materials, or may be a combination of the aforementioned materials. The materials of semiconductor layer 4 have detection wavelengths that are different from each other. Therefore, when the material of semiconductor layer 4 is a combination of the aforementioned semiconductor materials, electromagnetic wave detector 100 including semiconductor layer 4 can detect multiple wavelengths.

It is desired that semiconductor layer 4 is doped with an impurity so that the resistivity is less than or equal to 100 $\Omega \cdot cm$. As will be described later, pn junction may be provided inside semiconductor layer 4. In the case where pn junction is provided, the readout speed of the photo carrier generated in the pn junction interface improves by doping semiconductor layer 4 at high concentration, and hence the response speed of electromagnetic wave detector 100 improves.

<Method for Producing Electromagnetic Wave Detector 100>

Next, referring to FIG. 1, a method for producing electromagnetic wave detector 100 according to Embodiment 1 is described.

A method for producing electromagnetic wave detector 100 includes a preparatory step, a first insulating film forming step, a resist removing step, a first electrode forming step, an opening forming step, a two-dimensional material layer forming step, a second insulating film forming step, and a control electrode forming step. The preparatory step, the first insulating film forming step, the resist removing step, the first electrode forming step, the opening forming step, the two-dimensional material layer forming step, the second insulating film forming step, and the control electrode forming step are sequentially performed.

First, the preparatory step is performed. In the preparatory step, as shown in FIG. 1, a flat semiconductor substrate containing silicon (Si) or the like is prepared as semiconductor layer 4. The material of the semiconductor substrate is a material having sensitivity to a predetermined detection wavelength.

Subsequently, the second electrode forming step is performed. In the second electrode forming step, a resist is formed as a protective film on first surface 4a of semiconductor layer 4. Second electrode 2b is deposited on second surface 4b of semiconductor layer 4. Before deposition of second electrode 2b, an unillustrated close adherence layer may be formed in a region of second surface 4b of semiconductor layer 4 where second electrode 2b is to be deposited.

Subsequently, the resist removing step is performed. In the resist removing step, the resist is removed from first surface 4a of semiconductor layer 4.

Subsequently, the first insulating film forming step is performed. In the first insulating film forming step, first insulating film 3a is formed on first surface 4a of semiconductor layer 4. For example, when the material of semiconductor layer 4 is silicon (Si), first insulating film 3a may be heat-oxidized silicon oxide ($SiO_2$). Also, the method of depositing first insulating film 3a may be a CVD (Chemical Vapor Deposition) method or a sputtering method.

Subsequently, the first electrode forming step is performed. In the first electrode forming step, first electrode 2a is formed on first insulating film 3a. Before formation of the first electrode, a close adherence layer may be formed in a region of first insulating film 3a where first electrode 2a is to be formed.

As a method for forming first electrode 2a, for example, the following process is used. First, a resist mask is formed on the top surface of first insulating film 3a by photochemical engraving or electron beam (EB) lithography. In a region of the resist mask where first electrode 2a is to be formed, an open region is formed. Thereafter, a film of metal or the like that is to be first electrode 2a is formed on the resist mask. For formation of the film, an evaporation method or a sputtering method or the like is used. At this time, the film is formed to extend from inside the open region of the resist mask to the top surface of the resist mask. Thereafter, the resist mask is removed together with a part of the film. The other part of the film having been arranged in the open region of the resist mask remains on the surface of first insulating film 3a to become first electrode 2a. The above-described method is generally called a lift-off method.

As a method for forming first electrode 2a, other method may be used. For example, on the surface of first insulating film 3a, a film such as a metal film that is to be first electrode 2a is previously deposited. Thereafter, a resist mask is formed on the film by the photolithography method. The resist mask is formed to cover the region where first electrode 2a is to be formed, but is not formed in the region other than the region where first electrode 2a is to be formed. Thereafter, the film is partially removed by the wet etching or dry etching with the resist mask being a mask. As a result, a part of the film remains under the resist mask. The part of the film becomes first electrode 2a. Thereafter, the resist mask is removed. First electrode 2a may be formed in this manner.

Subsequently, the opening forming step is performed. The opening forming step may be performed previous to the first electrode forming step. In the opening forming step, the first insulating film is provided with opening OP. Specifically, an unillustrated resist mask is formed on first insulating film 3a by photochemical engraving or electron beam lithography. An open region is formed in a region of the resist mask where opening OP is to be formed in first insulating film 3a. Thereafter, first insulating film 3a is etched with the resist mask being an etching mask. The etching technique is appropriately selected from either of the wet etching and the dry etching. After the etching, the resist mask is removed. In this manner, first insulating film 3a is provided with opening OP.

Subsequently, the two-dimensional material layer forming step is performed. In the two-dimensional material layer forming step, two-dimensional material layer 1 is formed so that first electrode 2a, first insulating film 3a, and semiconductor layer 4 exposed inside opening OP are coved with two-dimensional material layer 1. The method for forming two-dimensional material layer 1 is not particularly limited. Two-dimensional material layer 1 may be formed, for example, by epitaxial growth, or may be formed by screen printing. Also, two-dimensional material layer 1 may be formed by transferring and bonding a two-dimensional material film that has been deposited in advance by a CVD method. Two-dimensional material layer 1 may be formed by transferring and bonding a two-dimensional material film that has been peeled off by mechanical peeling or the like.

After forming two-dimensional material layer 1, a resist mask is formed on two-dimensional material layer 1 by photochemical engraving or the like. The resist mask is formed such that it covers the region where two-dimensional material layer 1 is to be formed, while exposing the remaining region. Thereafter, two-dimensional material layer 1 is etched with the resist mask being an etching mask. The etching technique is, for example, dry etching by oxygen plasma. Thereafter, the resist mask is removed. As a result, two-dimensional material layer 1 shown in FIG. 1 is formed.

Subsequently, the second insulating film forming step is performed. In the second insulating film forming step, an insulating film is formed on two-dimensional material layer 1. The method for forming second insulating film 3b is for example, an electron beam evaporation, a CVD method, a sputtering method or the like. The method for forming second insulating film 3b is desirably a forming method that does not injure two-dimensional material layer 1. The shape of second insulating film 3b is processed by photolithography or the like. The shape of second insulating film 3b may be the same as the shape of the region of control electrode 2c where control electrode 2c is in contact with second insulating film 3b as shown in FIG. 1, at the point of time of the second insulating film forming step. Also, the shape of second insulating film 3b may be processed into a large shape to such an extent that control electrode 2c is not in direct contact with two-dimensional material layer 1 at the point of time of the second insulating film forming step. Also, the shape of second insulating film 3b may be processed after formation of control electrode 2c in the control electrode forming step. Similar to the above-described opening OP forming step, after forming a resist mask by photolithography or EB lithography, second insulating film 3b is processed by dry etching or the like.

Subsequently, the control electrode forming step is performed. In the control electrode forming step, control electrode 2c is formed on second insulating film 3b. The method for forming control electrode 2c is the same as the method for forming first electrode 2a in the first electrode forming step.

In the manner as described above, electromagnetic wave detector 100 according to the present embodiment is produced.

While two-dimensional material layer 1 is formed on first electrode 2a in the above-described production method, first electrode 2a may be formed to overlap a part of two-dimensional material layer 1 after forming two-dimensional material layer 1 on first insulating film 3a. In this case, however, it is necessary to take care not to injure two-dimensional material layer 1 by the formation process of first electrode 2a at the time of forming first electrode 2a.

<Principle of Operation of Electromagnetic Wave Detector 100>

Next, with reference to FIG. 1, the principle of operation of electromagnetic wave detector 100 according to Embodiment 1 is described.

As shown in FIG. 1, an unillustrated first power circuit is electrically connected between first electrode 2a and second electrode 2b. Bias voltage V1 is applied between first electrode 2a second electrode 2b. As a result, a current circuit in which first electrode 2a, two-dimensional material layer 1, semiconductor layer 4, and second electrode 2b are sequentially connected in series is formed inside electromagnetic wave detector 100. In two-dimensional material layer 1, a current I flows. By an unillustrated ammeter connected to the first power circuit, current I flowing in two-dimensional material layer 1 is measured. As a result, electromagnetic wave detector 100 comes into a state that it can detect an electromagnetic wave. The positive or negative of the voltage is selected according to the conductive type (doping type) of semiconductor layer 4. When the conductive type of semiconductor layer 4 is p-type, a positive voltage is applied to first electrode 2a. When the conductive type of semiconductor layer 4 is n-type, a negative voltage is applied to first electrode 2a.

As an electromagnetic wave with a wavelength to which semiconductor layer 4 has sensitivity (electromagnetic wave having detection wavelength) is applied to semiconductor layer 4, a photo carrier is generated inside semiconductor layer 4. Two-dimensional material layer 1 and semiconductor layer 4 function as a diode. Therefore, the photo carrier generated in the region facing opening OP of semiconductor layer 4 is injected to first part 1a of two-dimensional material layer 1. Passing of the photo carrier through the first part 1a causes variation in the magnitude of current I. In the present embodiment, the current component that causes variation in magnitude of current by application of an electromagnetic wave is called photocurrent.

The above-described photo-gating effect is caused in the following process. Since semiconductor layer 4 and first insulating film 3a function as a diode, a depletion layer is formed in the interface between semiconductor layer 4 and first insulating film 3a by application of voltage to semiconductor layer 4. By application of an electromagnetic wave having a detection wavelength to semiconductor layer 4, a photo carrier is generated also in the depletion layer. The photo carrier generated in the depletion layer gives a filed effect to third part 1c of two-dimensional material layer 1 via first insulating film 3a. As a result, the resistance of two-dimensional material layer 1 varies, and current I flowing in two-dimensional material layer 1 varies. That is, by application of an electromagnetic wave to semiconductor layer 4, a field effect is generated. By the field effect, electric characteristics of two-dimensional material layer 1 change.

The variation in current I is detected via first electrode 2a that is electrically connected to two-dimensional material layer 1. More specifically, the variation in current I is detected by an unillustrated ammeter connected to an unillustrated first power circuit that is electrically connected to the first power circuit. In this way, electromagnetic wave detector 100 detects the electromagnetic wave applied to electromagnetic wave detector 100.

Here, electromagnetic wave detector 100 according to the present embodiment is not limited to the above-described configuration in which variation in current in two-dimensional material layer 1 is detected by an unillustrated ammeter. For example, a constant current is caused to flow between first electrode 2a and second electrode 2b, and variation in voltage V between first electrode 2a and second electrode 2b (namely, variation in voltage value in two-dimensional material layer 1) may be detected by an unillustrated voltmeter.

Also, the above-described electromagnetic wave detector 100 may be arranged as a first electromagnetic wave detector, and a second electromagnetic wave detector having the same configuration as the first electromagnetic wave detector may further be arranged. The first electromagnetic wave detector is arranged in a space where an electromagnetic wave is applied. The second electromagnetic wave detector is arranged in a space shielded from an electromagnetic wave. The detection may be performed by detecting difference between the current of the first electromagnetic wave detector and the current of the second electromagnetic wave detector. The detection may be performed by detecting difference between the voltage of the first electromagnetic wave detector and the voltage of the second electromagnetic wave detector.

Operation and Effect

Subsequently, operation and effect of the present embodiment is described.

According to electromagnetic wave detector 100 according to Embodiment 1, electromagnetic wave detector 100 includes control electrode 2c as shown in FIG. 1. Therefore, it is possible to vary the Fermi level of two-dimensional material layer 1 by applying voltage (control voltage V2) to control electrode 2c.

More specifically, the Fermi level of two-dimensional material layer 1 is instable. Therefore, the Fermi level of two-dimensional material layer 1 varies depending on the manufacturing environment and the operation environment of electromagnetic wave detector 100. The variation by the operation environment is, for example, doping from insulating films and electrodes, and aged deterioration. Therefore, the Fermi level of two-dimensional material layer 1 can vary to the energy at which a Schottky barrier is not formed between two-dimensional material layer 1 and semiconductor layer 4. In this case, electromagnetic wave detector 100 fails to operate properly. Also, the Fermi level of two-dimensional material layer 1 can vary to the energy at which a Schottky barrier cannot be formed although it has been an energy at which a Schottky barrier can be formed at the time when electromagnetic wave detector 100 is produced. Meanwhile, in a Schottky type electromagnetic wave detector in which a two-dimensional material layer is formed on a semiconductor layer, the Fermi level of the two-dimensional material layer does not vary after formation of the two-dimensional material layer. Therefore, when the Fermi level of two-dimensional material layer 1 is not an energy at which a Schottky barrier can be formed, it is impossible to form a Schottky barrier. For this reason, it is necessary to vary the Fermi level of two-dimensional material layer 1 after production of electromagnetic wave detector 100.

Electromagnetic wave detector 100 according to the present embodiment includes control electrode 2c. Therefore, even after production of electromagnetic wave detector 100, the Fermi level of two-dimensional material layer 1 can be varied.

As shown in FIG. 1, electromagnetic wave detector 100 includes control electrode 2c. Therefore, it is possible to vary the Fermi level of two-dimensional material layer 1 to an energy at which a Schottky barrier is formed between two-dimensional material layer 1 and semiconductor layer 4. Therefore, it is possible to form a Schottky barrier between two-dimensional material layer 1 and semiconductor layer 4.

As a result, it is possible to change the Schottky barrier. Therefore, it is possible to change the cutoff wavelength. The cutoff wavelength is a wavelength range to which electromagnetic wave detector 100 can respond. Therefore, by applying control voltage V2 to two-dimensional material layer 1, it is possible to control the cutoff wavelength.

As shown in FIG. 1, control electrode 2c and two-dimensional material layer 1 sandwich second insulating film 3b. Therefore, after formation of two-dimensional material layer 1, control electrode 2c can be formed. Therefore, it is possible to reduce the recesses and projections of two-dimensional material layer 1 compared to the case where two-dimensional material layer 1 is formed on control electrode 2c after formation of control electrode 2c. That is, it is possible to make two-dimensional material layer 1 flat. Therefore, the performance of two-dimensional material layer 1 improves. Also, after formation of two-dimensional material layer 1, first electrode 2a, second electrode 2b and control electrode 2c can be formed at the same time.

Therefore, it is possible to reduce the production steps of electromagnetic wave detector 100.

As shown in FIG. 1, electromagnetic wave detector 100 is configured to vary the voltage difference between first electrode 2a and second electrode 2b. Therefore, it is possible to apply bias voltage V1 to two-dimensional material layer 1 and semiconductor layer 4 so that the photo carrier exceeds the Schottky barrier. Therefore, it is possible to inject the photo carrier to two-dimensional material layer 1 from semiconductor layer 4. Therefore, it is possible to improve the detection sensitivity of electromagnetic wave detector 100.

As shown in FIG. 1, electromagnetic wave detector 100 is configured to vary the Fermi level of two-dimensional material layer 1 by applying a voltage to control electrode 2c. Therefore, even after production of electromagnetic wave detector 100, the Fermi level of two-dimensional material layer 1 can be varied.

As shown in FIG. 1, control electrode 2c includes plurality of control electrode parts 2c0. Therefore, by applying different control voltages to plurality of control electrode parts 2c0 respectively, it is possible to form a gradient of potential in two-dimensional material layer 1. By the gradient of potential, an internal field is formed in two-dimensional material layer 1. Therefore, it is possible to improve the extraction efficiency of the photo carrier generated by photoelectric conversion in two-dimensional material layer 1 at the time of application of an electromagnetic wave. In the present embodiment, the extraction efficiency is an efficiency of migration of the photo carrier from semiconductor layer 4 to two-dimensional material layer 1. As a result, it is possible to increase the photocurrent flowing in two-dimensional material layer 1. Therefore, it is possible to improve the sensitivity of electromagnetic wave detector 100.

Two-dimensional material layer 1 contains a material selected from the group consisting of graphene, transition metal dichalcogenide, black phosphorus, silicene, graphene nanoribbon, and borophene. Therefore, it is possible to securely obtain the operation and effect of the present embodiment.

When the material of two-dimensional material layer 1 is monolayer graphene, the thickness of two-dimensional material layer 1 is thin because it corresponds to a single atomic layer. The carrier mobility in monolayer graphene is relatively large compared with a conventional semiconductor material. Therefore, in two-dimensional material layer 1, large current variation occurs for slight potential variation as compared with a conventional semiconductor material. For example, a variation of current caused by variation in potential applied to two-dimensional material layer 1 by field change in semiconductor layer 4 is larger than a variation of current in a normal semiconductor. Specifically, the variation of current in two-dimensional material layer 1, calculated from mobility of electron, thickness and the like in two-dimensional material layer 1, is about several hundred times to several thousand times the variation of current in a normal semiconductor. Therefore, in electromagnetic wave detector 100 according to the present embodiment, it becomes possible to detect an electromagnetic wave at higher sensitivity compared with the electromagnetic wave detector that detects only the photo carrier generated in semiconductor layer 4.

Thus, in electromagnetic wave detector 100 according to the present embodiment, a photocurrent caused by photoelectric conversion of two-dimensional material layer 1 is also generated in addition to a current generated in semiconductor layer 4 by application of light and a current associated with the photo-gating effect. Electromagnetic wave detector 100 is capable of detecting a photocurrent caused by photoelectric conversion that is inherent to two-dimensional material layer 1, in addition to a current generated in semiconductor layer 4 by incidence of an electromagnetic wave and a current associated with the photo-gating effect.

As shown in FIG. 1, two-dimensional material layer 1 is electrically connected to semiconductor layer 4 in opening OP. Accordingly, two-dimensional material layer 1 and semiconductor layer 4 function as a diode. Therefore, by applying reverse bias to two-dimensional material layer 1 and semiconductor layer 4, it is possible to make current I in the condition that light is not applied zero. In other words, by application of reverse bias, it becomes possible to make electromagnetic wave detector 100 perform OFF operation. As a result, it is possible to suppress flow of a dark current in two-dimensional material layer 1, and hence it is possible to improve the sensitivity of electromagnetic wave detector 100. Also in the condition that light is applied, only the current derived from the photo carrier injected to two-dimensional material layer 1 is detected as current I flowing in electromagnetic wave detector 100. The current derived from the photo carrier injected to two-dimensional material layer 1 is detected after the magnitude of the current is varied by the above-described photo-gating effect.

As shown in FIG. 1, two-dimensional material layer 1 extends from above opening OP to first insulating film 3a. Accordingly, two-dimensional material layer 1 is connected to semiconductor layer 4 with first insulating film 3a interposed therebetween. Therefore, a photo-gating effect is generated in two-dimensional material layer 1, and the voltage of two-dimensional material layer 1 varies. The voltage variation in two-dimensional material layer 1 is approximately regarded as application of the gate voltage to two-dimensional material layer 1. As a result, it is possible to modulate the conductivity of two-dimensional material layer 1. Therefore, it is possible to amplify the photocurrent injected to two-dimensional material layer 1 from semiconductor layer 4.

The photo-gating effect does not directly enhance the quantum efficiency of the photoelectric conversion material, but enlarges the current variation by incidence of an electromagnetic wave. Therefore, the quantum efficiency that is equivalently calculated from the differential current by incidence of an electromagnetic wave exceeds 100%, and the equivalent quantum efficiency when optimized reaches 1000% to about 10000%. Therefore, the variation in current I when an electromagnetic wave is applied to electromagnetic wave detector 100 according to the present embodiment is larger than the variation in current when the electromagnetic wave enters a conventional electromagnetic wave detector in which a photo-gating effect is not exerted. Therefore, electromagnetic wave detector 100 according to the present embodiment has high sensitivity as compared with a conventional electromagnetic wave detector.

Embodiment 2

Figure 8:
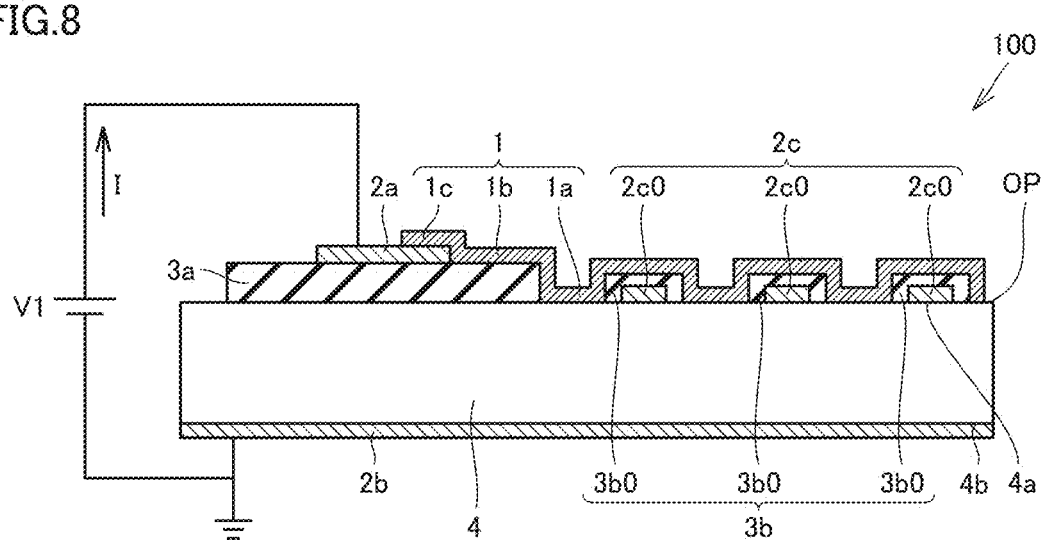
FIG. 8 is a section view schematically showing a configuration of an electromagnetic wave detector according to Embodiment 2.

Next, referring to FIG. 8, a configuration of electromagnetic wave detector 100 according to Embodiment 2 is described. Embodiment 2 has the same configuration, production method and operation and effect as Embodiment 1 unless otherwise described. Therefore, the same configuration as that in Embodiment 1 is denoted by the same reference numeral, and description thereof is not repeated.

In the present embodiment, control electrode 2c and second electrode 2b sandwich semiconductor layer 4. Second electrode 2b is directly connected to semiconductor layer 4. Second insulating film 3b covers control electrode 2c. Two-dimensional material layer 1 covers semiconductor layer 4, first insulating film 3a and second insulating film 3b. Control electrode 2c is arranged below two-dimensional material layer 1. Also, control electrode 2c is connected to an unillustrated second power circuit in a part extending backward or frontward of the page. Electromagnetic wave detector 100 according to the present embodiment differs from electromagnetic wave detector 100 according to Embodiment 1 in that control electrode 2c is arranged below the graphene layer.

Next, a method for producing electromagnetic wave detector 100 according to Embodiment 2 is described.

In a production method of electromagnetic wave detector 100 according to the present embodiment, the above-described first insulating film forming step, opening OP forming step, second insulating film forming step, and control electrode forming step are sequentially performed, and then the two-dimensional material layer forming step is performed. That is, after formation of first insulating film 3a, second insulating film 3b and control electrode 2c, two-dimensional material layer 1 is formed. Accordingly, two-dimensional material layer 1 is deposited at last.

The configuration of electromagnetic wave detector 100 according to Embodiment 2 is also applied to other embodiments.

Subsequently, operation and effect of the present embodiment is described.

According to electromagnetic wave detector 100 according to Embodiment 2, as shown in FIG. 8, two-dimensional material layer 1 covers semiconductor layer 4, first insulating film 3a and second insulating film 3b. Therefore, after formation of first insulating film 3a, second insulating film 3b and control electrode 2c, two-dimensional material layer 1 can be formed. Therefore, it is possible to suppress injury of two-dimensional material layer 1 in the process of forming second insulating film 3b and control electrode 2c. Also, it is possible to suppress residue of the resist or the like. Therefore, it is possible to improve the performance of electromagnetic wave detector 100.

Embodiment 3

Next, referring to FIGS. 9 to 12, a configuration of electromagnetic wave detector 100 according to Embodiment 3 is described. Embodiment 3 has the same configuration, production method and operation and effect as Embodiment 1 unless otherwise described. Therefore, the same configuration as that in Embodiment 1 is denoted by the same reference numeral, and description thereof is not repeated.

Figure 9:
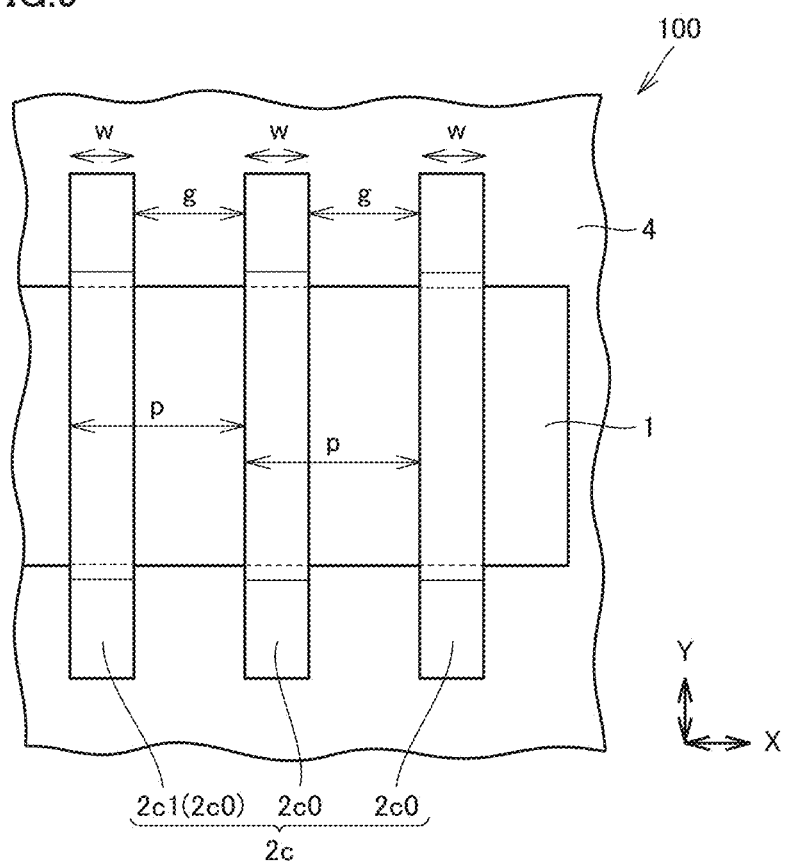
FIG. 9 is an enlarged view of a region corresponding to IX region of FIG. 2 schematically showing a first configuration of an electromagnetic wave detector according to Embodiment 3.
Figure 10:
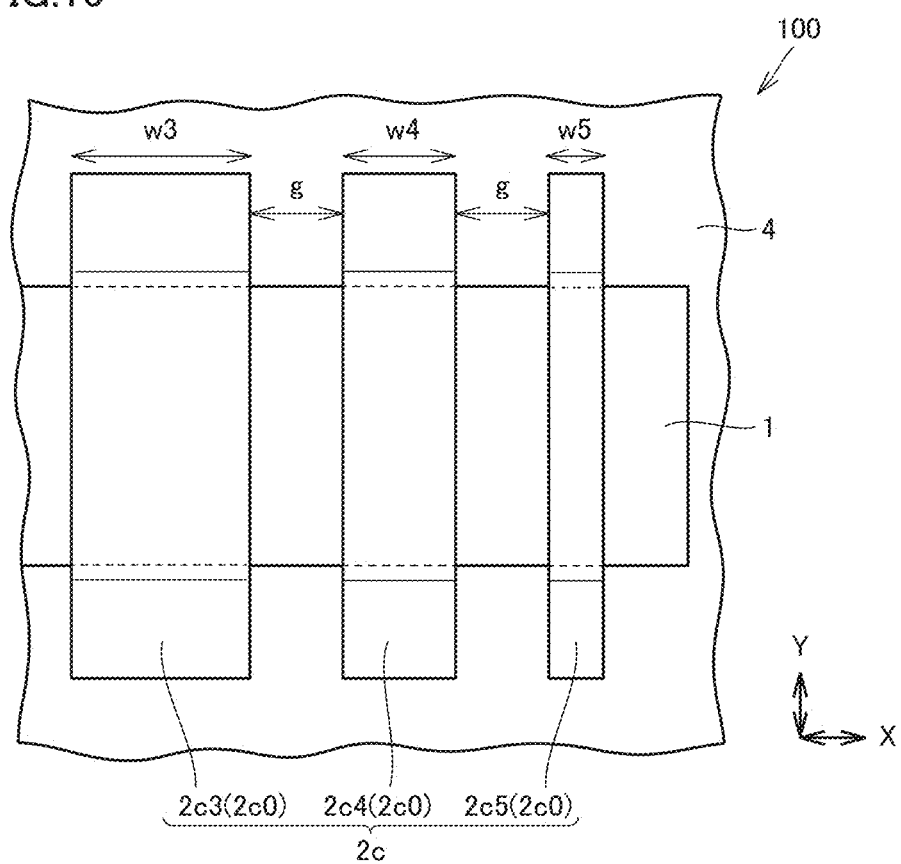
FIG. 10 is a top view corresponding to FIG. 9 schematically showing a second configuration of the electromagnetic wave detector according to Embodiment 3.
Figure 11:
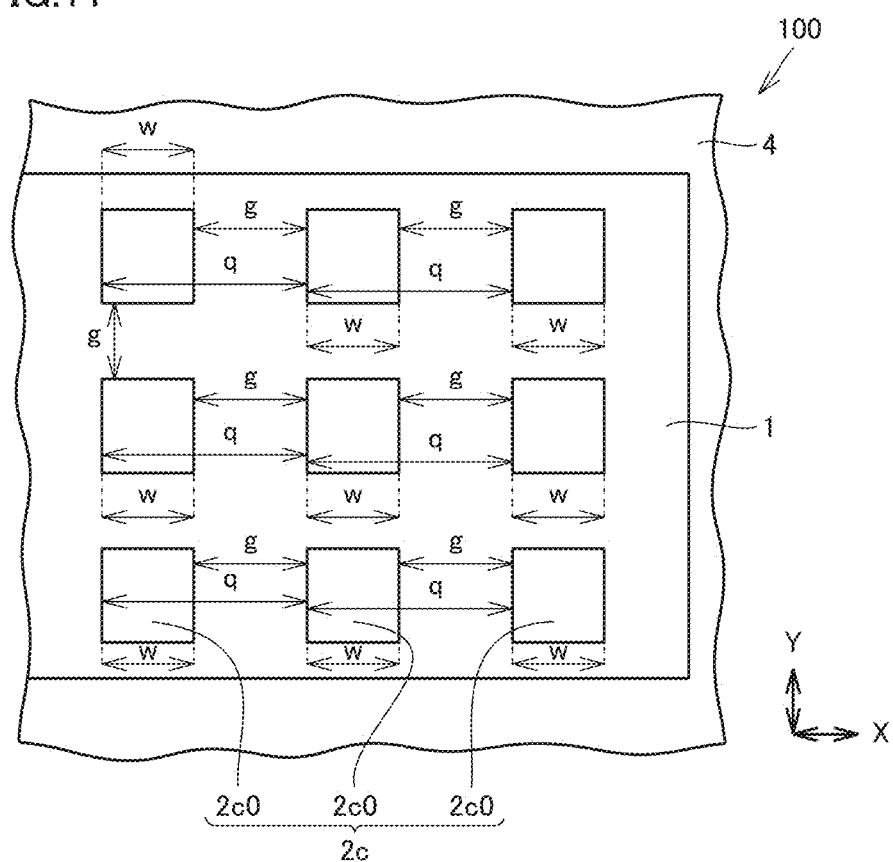
FIG. 11 is a top view corresponding to FIG. 9 schematically showing a third configuration of the electromagnetic wave detector according to Embodiment 3.
Figure 12:
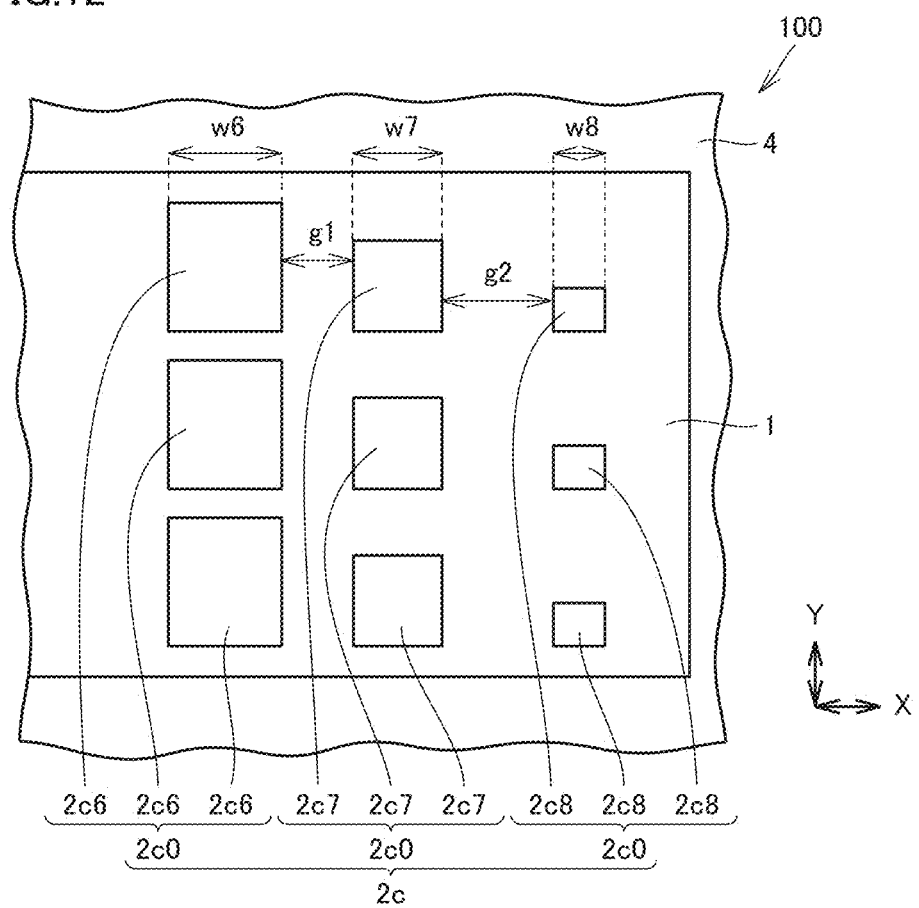
FIG. 12 is a top view corresponding to FIG. 9 schematically showing a fourth configuration of the electromagnetic wave detector according to Embodiment 3.

FIG. 9 is a top view schematically showing a first configuration of Embodiment 3. FIG. 9 is a partial enlarged view of the region corresponding to IX region in FIG. 2. FIGS. 10 to 12 are top views of the region corresponding to FIG. 9.

As shown in FIG. 9, in the present embodiment, electromagnetic wave detector 100 is configured such that surface plasmon resonance is generated in control electrode 2c. The material of control electrode 2c is a material in which surface plasmon resonance is generated. The material of control electrode 2c is a material in which surface plasmon resonance is generated by an electromagnetic wave having a detection wavelength. When the detection wavelength of electromagnetic wave detector 100 ranges from wavelengths of visible light to wavelengths of infrared rays, the material of control electrode 2c is, for example, aluminum (Al), gold (Au) and the like. Also, the face on which an electromagnetic wave enters control electrode 2c among faces of control electrode 2c may be coated with a coating material in which plasmon resonance is generated. Examples of the coating material in which plasmon resonance is generated include titanium nitride (TiN), a transparent conductive film (ITO film: indium tin oxide film), and graphene. The coating material may be a material other than metal materials. Also, for example, the electrode itself may be graphene. Graphene may be of monolayer or multilayer, and may be graphite in the case of multilayer.

As shown in FIG. 9, control electrode 2c includes plurality of control electrode parts 2c0. Among plural control electrode parts 2c0, neighboring control electrode parts 2c0 are arranged at such an interval that surface plasmon resonance is generated in each of plural control electrode parts 2c0. Plurality of control electrode parts 2c0 are periodically arranged. In the present embodiment, the expression "plurality of control electrode parts 2c0 are periodically arranged" means that intervals between neighboring control electrode parts 2c0 among plurality of control electrode parts 2c0 are constant.

In control electrode part 2c0, the wavelength at which surface plasmon resonance is generated is determined by the width w of control electrode part 2c0, interval g and period p between neighboring control electrode parts 2c0. Width w is a dimension along the X-axial direction of control electrode part 2c0. Interval g is an interval along the X-axial direction between neighboring control electrode parts 2c0. Period p is a sum of interval g and width w. In the present embodiment, the width, the interval and the period along the X-axial direction are described, however, electromagnetic wave detector 100 may have the same configuration regarding the width, the interval and the period along the Y-axial direction.

For example, in an infrared wave range, when the material on the incidence side of control electrode part 2c0 is gold (Au), the plasmon resonance wavelength is 10 μm when width w is 2 μm and interval g is 1 μm. By appropriately adjusting width w, interval g and period p, plasmon resonance is generated at a wavelength other than the aforementioned infrared wave range. While three control electrode part 2c0 are arranged in FIGS. 9 and 10, and nine control electrode parts 2c0 are arranged in FIGS. 11 and 12, the number of control electrode parts 2c0 is not limited. While plurality of control electrode parts 2c0 are arranged one-dimensionally and periodically in FIGS. 9 and 10, they may be arranged two-dimensionally and periodically as shown in FIGS. 11 and 12. In both cases where plurality of control electrode parts 2c0 are arranged one-dimensionally and two-dimensionally, plasmon resonance is generated in control electrode parts 2c0 by appropriately adjusting width w, interval g, and period p of control electrode parts 2c0. As these parameters differ, the plasmon resonance wavelength also differs. In the structures of FIGS. 9 to 12, width w is the most dominant parameter, however, which parameter is dominant depends on the structure.

The shape and arrangement of control electrode part 2c0 may be appropriately determined as long as plasmon resonance is generated in control electrode part 2c0. Plasmon resonance can be generated in control electrode part 2c0 regardless of whether the shape of control electrode part 2c0 is a polygon such as a rectangle, a square, and a triangle, or a circle. The shape of control electrode part 2c0 may be a fractal. Plurality of control electrode parts 2c0 may be arranged concentrically.

When the thickness of semiconductor layer 4 is small, a metamaterial structure in which metal, a dielectric, and metal are sequentially laminated is formed by second electrode 2b, control electrode 2c, second insulating film 3b and semiconductor layer 4. When a metamaterial structure is formed, the dominant parameter that determines the plasmon resonance wavelength is width w of control electrode part 2c0.

As shown in FIGS. 9 and 10, each of plurality of control electrode parts 2c0 may extend along the X-axial direction. Each of plurality of control electrode parts 2c0 may be arranged in line along the Y-axial direction.

As shown in FIG. 10, plurality of control electrode parts 2c0 may include a third control electrode part 2c3, a fourth control electrode part 2c4 and a fifth control electrode part 2c5. Third control electrode part 2c3, fourth control electrode part 2c4 and fifth control electrode part 2c5 respectively have widths w3, w4 and w5 that are different from each other. Interval g between third control electrode part 2c3 and fourth control electrode part 2c4 is the same as interval g between fourth control electrode part 2c4 and fifth control electrode part 2c5. Interval g may be different.

As shown in FIG. 11, neighboring control electrode parts 2c0 may be arranged at the same interval g in each of the X-axial direction and Y-axial direction.

As shown in FIG. 12, plurality of control electrode parts 2c0 may include a plurality of sixth control electrode parts 2c6, a plurality of seventh control electrode parts 2c7 and a plurality of eighth control electrode parts 2c8. Each of plurality of sixth control electrode parts 2c6 has width w6. Each of plurality of seventh control electrode parts 2c7 has width w7. Each of plurality of eighth control electrode parts 2c8 has width w8. Width w6, width w7 and width w8 are different from each other. Interval g1 between neighboring sixth control electrode part 2c6 and seventh control electrode part 2c7 is smaller than interval g2 between neighboring seventh control electrode part 2c7 and eighth control electrode part 2c8. Intervals between neighboring sixth control electrode parts 2c6 are mutually the same. Intervals between neighboring seventh control electrode parts 2c7 are mutually the same. Intervals between neighboring eighth control electrode parts 2c8 are mutually the same.

In FIGS. 10 and 12, when at least one of width w, period p and interval g differs, the plasmon resonance wavelength in the region having a different structure differs, so that the plasmon resonance wavelength is multiplied. When different plasmon resonance wavelengths approach to each other, the resonance wavelength spans in a broader band range.

The configuration of electromagnetic wave detector 100 according to Embodiment 3 may be applied to other embodiments.

Subsequently, operation and effect of the present embodiment is described.

According to electromagnetic wave detector 100 according to Embodiment 3, the material of control electrode 2c is a material in which surface plasmon resonance is generated. Therefore, in control electrode 2c, surface plasmon resonance can be generated. Therefore, it is possible to improve the sensitivity of electromagnetic wave detector 100. The mechanism of improving the sensitivity of electromagnetic wave detector 100 by surface plasmon resonance is described later.

As shown in FIG. 9, among plural control electrode parts 2c0, neighboring control electrode parts 2c0 are arranged at such an interval that surface plasmon resonance is generated in each of plural control electrode parts 2c0. Therefore, in each of plural control electrode parts 2c0, surface plasmon resonance can be generated. Therefore, it is possible to improve the sensitivity of electromagnetic wave detector 100.

Subsequently, the mechanism of improving the sensitivity of electromagnetic wave detector 100 by surface plasmon resonance is described. When plasmon resonance is generated in control electrode 2c, the electromagnetic field is enhanced in the vicinity of control electrode 2c and control electrode 2c. The enhancement of the electromagnetic field is also called localized surface plasmon resonance. The electromagnetic field is simultaneously enhanced also in two-dimensional material layer 1 to which control electrode 2c is connected. Therefore, the absorptance of photo carrier of two-dimensional material layer 1 increases. The absorptance of photo carrier of two-dimensional material layer 1 is improved to nearly 100% by appropriate designing of width w, interval g and period p. The electromagnetic field is simultaneously enhanced also in semiconductor layer 4. As a result, the photoelectric conversion efficiency of semiconductor layer 4 is enhanced, and the photo carrier generated in semiconductor layer 4 increases.

As indicated above, since a larger quantity of photo carrier is absorbed by two-dimensional material layer 1, the current flowing in two-dimensional material layer 1 increases. Also, since a larger quantity of photo carrier is generated in semiconductor layer 4, the current flowing in two-dimensional material layer 1 increases. Since the current flowing in two-dimensional material layer 1 is finally extracted as a photo detection signal, the photo detection signal increases. Further, since the magnitude of the photo-gating effect in two-dimensional material layer 1 is proportional to the magnitude of the current flowing in two-dimensional material layer 1, the magnitude of the photo-gating effect increases. Therefore, the final photo detection signal is further enhanced. Therefore, it is possible to improve the detection performance of electromagnetic wave detector 100.

Enhancement of an electromagnetic field by plasmon resonance occurs only by an electromagnetic wave having a plasmon resonance wavelength. Therefore, an electromagnetic field is selectively enhanced by an electromagnetic wave having a plasmon resonance wavelength. Therefore, the sensitivity of electromagnetic wave detector 100 is selectively enhanced in the plasmon resonance wavelength. Therefore, by setting the detection wavelength to the plasmon resonance wavelength, electromagnetic wave detector 100 can selectively detect the electromagnetic wave having the detection wavelength. Alternatively, when the plasmon resonance wavelength is multiplied, the detection sensitivity is enhanced in multiple wavelengths.

Figure 13:
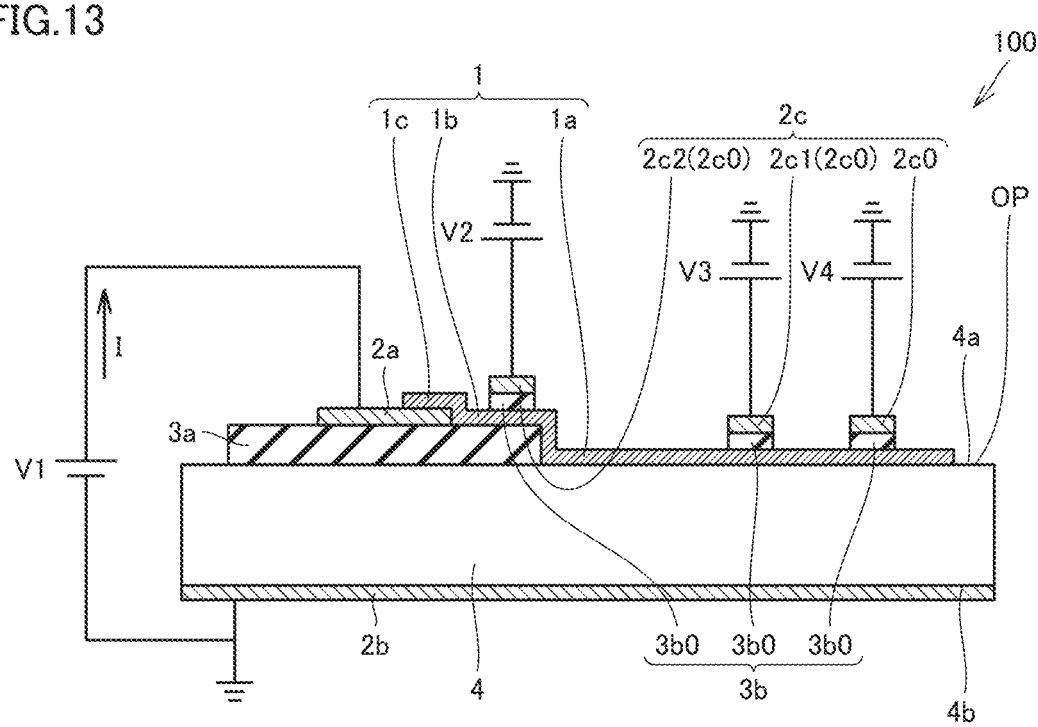
FIG. 13 is a section view schematically showing a configuration of an electromagnetic wave detector according to Embodiment 4.

As shown in FIG. 9, plurality of control electrode parts 2c0 include first control electrode parts 2c1. First control electrode part 2c1 is connected to a second part (see FIG. 1) of two-dimensional material layer 1 with second insulating film 3b (see FIG. 1) interposed therebetween. Also, when plasmon resonance is generated in an electrode, the electromagnetic field is strongly localized in a lower end part of the electrode. Therefore, plasmon resonance generated in first control electrode part 2c1 much enlarges the electromagnetic field than plasmon resonance generated in later-described second control electrode part 2c2 (FIG. 13). Therefore, it is possible to improve the sensitivity of electromagnetic wave detector 100.

As shown in FIG. 9, each of plurality of control electrode parts 2c0 extends along the Y-axial direction. Each of plurality of control electrode parts 2c0 is arranged in line along the X-axial direction. Therefore, only when the electric field of the electromagnetic wave entering electromagnetic wave detector 100 is parallel with the X-axial direction, plasmon resonance is generated by absorption of the electromagnetic wave. When the electric field of the electromagnetic wave is parallel with the Y-axial direction, the electromagnetic wave is not absorbed. In other words, electromagnetic wave detector 100 has polarization selectivity. Accordingly, electromagnetic wave detector 100 is capable of selectively detecting polarization. In the case where the shape of each of plurality of control electrode parts 2c0 is a square as shown in FIG. 11, and in the case where the shape is a circle, electromagnetic wave detector 100 does not have polarization selectivity.

As shown in FIGS. 10 and 12, plurality of control electrode parts 2c0 have mutually different widths, intervals and periods. Therefore, the plasmon resonance wavelength is multiplied. As shown in FIGS. 9 and 11, resonance is generated in multiwavelength, compared with the cases where plurality of control electrode parts 2c0 have mutually the same widths, intervals, and periods. When the respective resonance wavelengths are close, the resonance wavelength equivalently spans in a broad band range. Therefore, it is possible to broaden the detection wavelength of electromagnetic wave detector 100. In other words, it is possible to broaden the band range of the detection wavelength of electromagnetic wave detector 100.

Embodiment 4

Next, referring to FIG. 13, a configuration of electromagnetic wave detector 100 according to Embodiment 4 is described. Embodiment 4 has the same configuration, production method and operation and effect as Embodiment 3 unless otherwise described. Therefore, the same configuration as that in Embodiment 3 is denoted by the same reference numeral, and description thereof is not repeated.

As shown in FIG. 13, in the present embodiment, plurality of control electrode parts 2c0 include first control electrode parts 2c1 and second control electrode parts 2c2. Second control electrode part 2c2 is connected to second part 1b with second insulating film 3b interposed therebetween. Second control electrode part 2c2 is arranged above first insulating film 3a. Therefore, second control electrode part 2c2 is arranged outside opening OP. Second control electrode part 2c2 is not arranged inside opening OP. Between second control electrode part 2c2 and semiconductor layer 4, second insulating film 3b, two-dimensional material layer 1 and first insulating film 3a are sequentially laminated. The shortest distance between first control electrode part 2c1 and semiconductor layer 4 is shorter than the shortest distance between second control electrode part 2c2 and semiconductor layer 4.

The configuration of electromagnetic wave detector 100 according to Embodiment 4 may be applied to other embodiments.

Subsequently, operation and effect of the present embodiment is described.

According to electromagnetic wave detector 100 according to Embodiment 4, as shown in FIG. 13, second control electrode part 2c2 is connected to second part 1b with second insulating film 3b interposed therebetween. Therefore, at least one control electrode part 2c0 of plurality of control electrode parts 2c0 is not arranged inside opening OP. Therefore, it is possible to reduce the dimension of electromagnetic wave detector 100 along the in-plane direction of semiconductor layer 4 compared with the case where all control electrode parts 2c0 of plurality of control electrode parts 2c0 are arranged inside opening OP.

Embodiment 5

Figure 14:
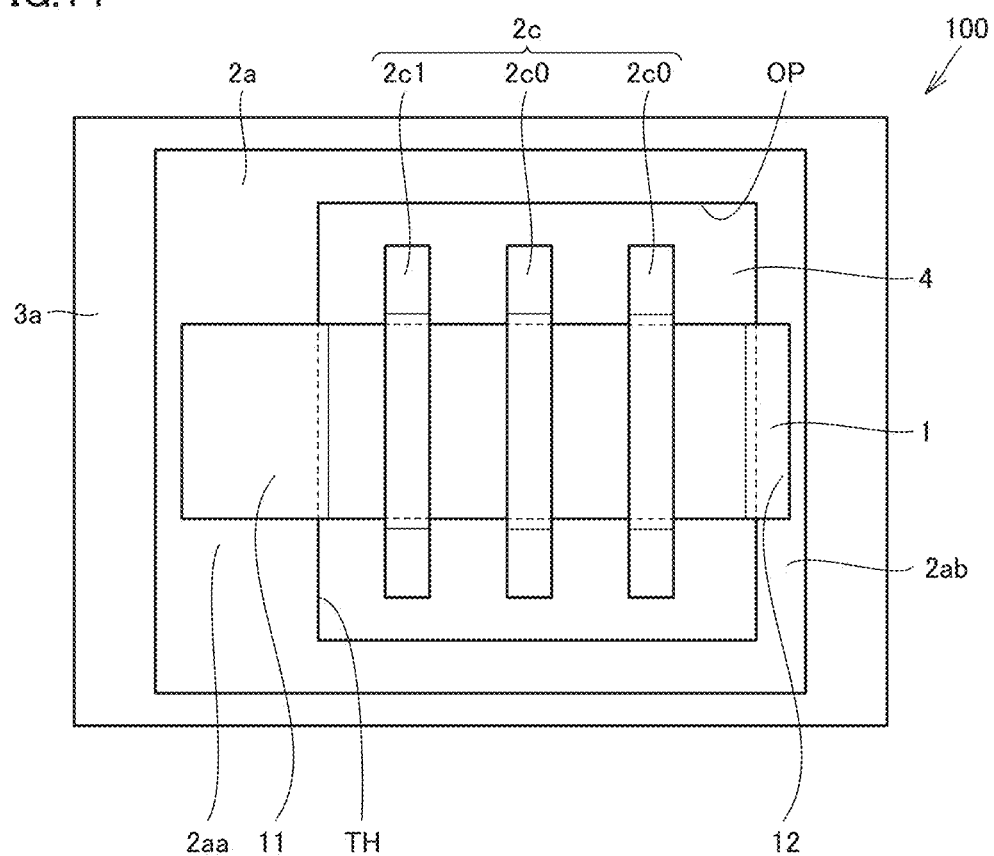
FIG. 14 is a top view schematically showing a configuration of an electromagnetic wave detector according to Embodiment 5.

Next, referring to FIG. 14, a configuration of electromagnetic wave detector 100 according to Embodiment 5 is described. Embodiment 5 has the same configuration, production method and operation and effect as Embodiment 3 unless otherwise described. Therefore, the same configuration as that in Embodiment 3 is denoted by the same reference numeral, and description thereof is not repeated.

As shown in FIG. 14, first electrode 2a includes a first side part 2aa and a second side part 2ab. Second side part 2ab and first side part 2aa sandwich opening OP. First electrode 2a is provided with a through-hole TH. Through-hole TH communicates with opening OP. Through-hole TH may be provided in the center of first electrode 2a. That is, first electrode 2a has a ring-like shape centered at through-hole TH. While first electrode 2a has a ring-like shape in FIG. 14, first electrode 2a may be U-shaped.

Two-dimensional material layer 1 includes a first end part 11 and a second end part 12. Second end part 12 is opposed to first end part 11. First end part 11 is directly connected to first side part 2aa. Second end part 12 is directly connected to second side part 2ab. Two-dimensional material layer 1 extends from first side part 2aa to second side part 2ab over through-hole TH. While part of two-dimensional material layer 1 is directly connected to first electrode 2a in FIG. 14, two-dimensional material layer 1 may be directly connected to the whole surface of first electrode 2a.

The configuration of electromagnetic wave detector 100 according to Embodiment 5 may be applied to other embodiments.

Subsequently, operation and effect of the present embodiment is described.

According to electromagnetic wave detector 100 according to the present embodiment, first end part 11 is directly connected to first side part 2aa. Second end part 12 is directly connected to second side part 2ab. Therefore, the current conveyed from two-dimensional material layer 1 to first electrode 2a increases compared with the case where either one end part of two-dimensional material layer 1 is not directly connected to first electrode 2a. Therefore, it is possible to improve the sensitivity of electromagnetic wave detector 100. Also, when two-dimensional material layer 1 is directly connected to the whole surface of first electrode 2a, it is possible to further improve the sensitivity of electromagnetic wave detector 100.

Embodiment 6

Figure 15:
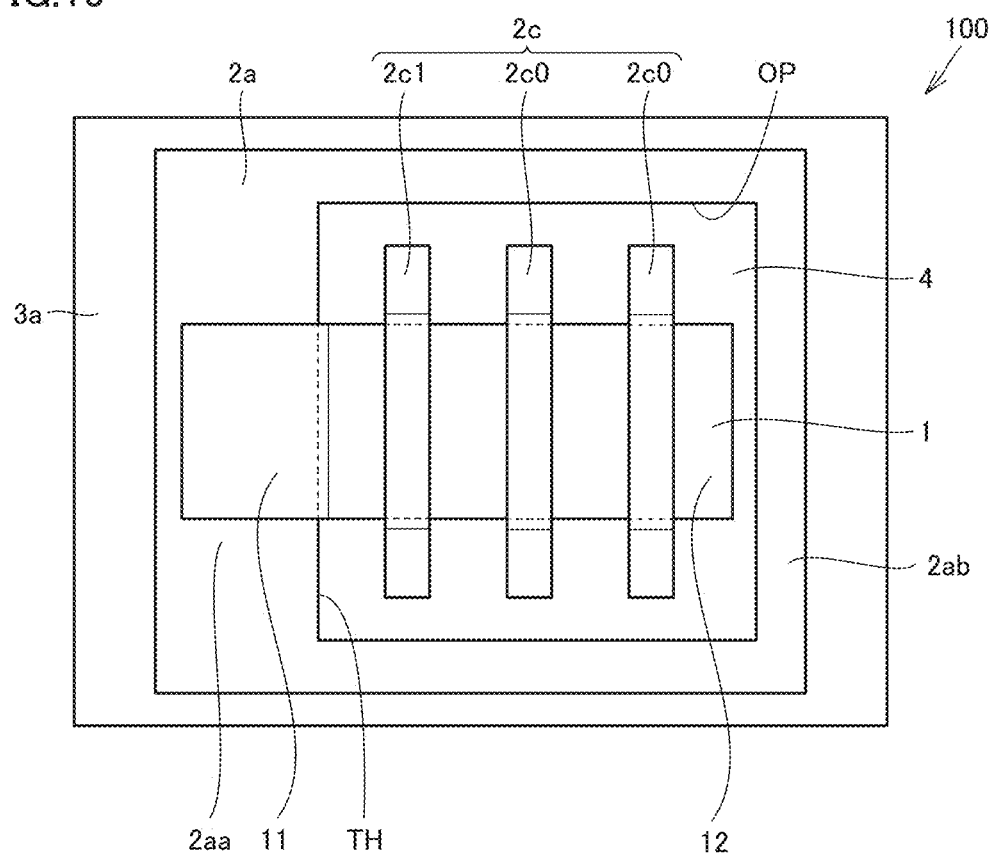
FIG. 15 is a top view schematically showing a configuration of an electromagnetic wave detector according to Embodiment 6.

Next, referring to FIG. 15, a configuration of electromagnetic wave detector 100 according to Embodiment 6 is described. Embodiment 6 has the same configuration, production method and operation and effect as Embodiment 5 unless otherwise described. Therefore, the same configuration as that in Embodiment 5 is denoted by the same reference numeral, and description thereof is not repeated.

As shown in FIG. 15, two-dimensional material layer 1 according to the present embodiment includes first end part 11 and second end part 12. First end part 11 is directly connected to first electrode 2a. First end part 11 is arranged outside opening OP. Second end part 12 is arranged away from first electrode 2a. Second end part 12 is not directly connected to first electrode 2a. Second end part 12 is arranged inside opening OP.

The configuration of electromagnetic wave detector 100 according to Embodiment 5 may be applied to other embodiments.

Subsequently, operation and effect of the present embodiment is described.

According to electromagnetic wave detector 100 according to Embodiment 5, first end part 11 is directly connected to first electrode 2a as shown in FIG. 15. Second end part 12 is arranged away from first electrode 2a. Therefore, contact between two-dimensional material layer 1 and semiconductor layer 4 is more excellent as compared with the case where both ends of two-dimensional material layer 1 are connected to first electrode 2a.

Assuming the case where both ends of two-dimensional material layer 1 are connected to first electrode 2a, there is a possibility that only the center part of two-dimensional material layer 1 comes into contact with semiconductor layer 4 due to generation of deflection in two-dimensional material layer 1. When only the center part of two-dimensional material layer 1 comes into contact with semiconductor layer 4, there is a possibility that an excellent characteristic is not obtained.

According to the present embodiment, second end part 12 is arranged away from first electrode 2a. Therefore, contact between two-dimensional material layer 1 and semiconductor layer 4 is excellent.

When contact between two-dimensional material layer 1 and semiconductor layer 4 is excellent, migration of generated photo carrier is not hindered by electromagnetic wave detector 100. Accordingly, the detection signal of electromagnetic wave detector 100 increases. And, the noise decreases. Therefore, it is possible to improve the performance of electromagnetic wave detector 100.

When the photo-gating effect is dominant, the sensitivity of electromagnetic wave detector 100 does not greatly depend on the contact area between two-dimensional material layer 1 and semiconductor layer 4. Therefore, when the contacting condition between two-dimensional material layer 1 and semiconductor layer 4 is improved, the path of photo carrier increases. Therefore, it is possible to reduce a pixel area of electromagnetic wave detector 100 (area of semiconductor layer 4). Therefore, it is possible to miniaturize electromagnetic wave detector 100.

Embodiment 7

Figure 16:
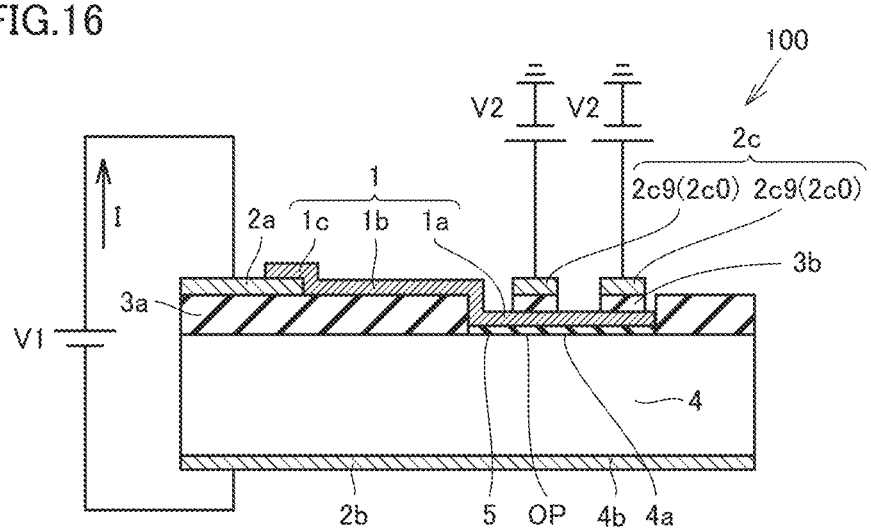
FIG. 16 is a section view schematically showing a configuration of an electromagnetic wave detector according to Embodiment 7.

Next, referring to FIG. 16, a configuration of electromagnetic wave detector 100 according to Embodiment 7 is described. Embodiment 7 has the same configuration, production method and operation and effect as Embodiment 3 unless otherwise described. Therefore, the same configuration as that in Embodiment 3 is denoted by the same reference numeral, and description thereof is not repeated.

As shown in FIG. 16, electromagnetic wave detector 100 according to the present embodiment further includes a buffer layer 5. Buffer layer 5 is sandwiched between two-dimensional material layer 1 and semiconductor layer 4. Buffer layer 5 electrically connects semiconductor layer 4 and first part 1a. Therefore, in the present embodiment, first part 1a is connected to semiconductor layer 4 with buffer layer 5 interposed therebetween. The thickness of buffer layer 5 is smaller than the thickness of first insulating film 3a. Plurality of control electrode parts 2c0 include a ninth control electrode part 2c9. Ninth control electrode part 2c9 is connected to buffer layer 5 with second insulating film 3b and two-dimensional material layer 1 interposed therebetween.

Buffer layer 5 has such a thickness that is capable of forming a tunnel current between two-dimensional material layer 1 and semiconductor layer 4. Buffer layer 5 is, for example, an insulating film having a thickness of greater than or equal to 1 nm and less than or equal to 10 nm. Buffer layer 5 is thinner than first insulating film 3a. Examples of the type of the insulating film include metal oxides such as alumina (aluminum oxide) or hafnium oxide ($HfO_2$), semiconductor oxides such as silicon oxide, and semiconductor nitrides such as silicon nitride ($Si_3N_4$).

While the method for preparing buffer layer 5 may be appropriately determined, it can be selected, for example, from an ALD (atomic layer deposition) method, a vacuum evaporation method, and a sputtering method. Buffer layer 5 may be formed by oxidizing or nitriding the surface of semiconductor layer 4. Buffer layer 5 may be a natural oxide film formed on the surface of semiconductor layer 4.

The thickness of buffer layer 5 according to a modified example of Embodiment 7 is larger than the thickness capable of forming a tunnel current between two-dimensional material layer 1 and semiconductor layer 4, and is smaller than the thickness of first insulating film 3a. Therefore, the photo carrier generated in semiconductor layer 4 is not injected into two-dimensional material layer 1 through buffer layer 5. Also, the photo-gating effect is generated. Since the thickness of buffer layer 5 is smaller than the thickness of first insulating film 3a, a gradient in carrier density is generated between two-dimensional material layer 1 in a region being in contact with first insulating film 3a, and two-dimensional material layer 1 being in contact with buffer layer 5.

The configuration of electromagnetic wave detector 100 according to Embodiment 7 and a modified example thereof may be applied to other embodiments.

Subsequently, operation and effect of the present embodiment is described.

According to electromagnetic wave detector 100 according to Embodiment 7, electromagnetic wave detector 100 further includes buffer layer 5 as shown in FIG. 16. Therefore, a gradient in carrier density is generated between two-dimensional material layer 1 in a region being in contact with first insulating film 3a (second part 1b), and two-dimensional material layer 1 in a region being in contact with buffer layer 5 (first part 1a). As a result, the mobility of two-dimensional material layer 1 increases, and hence the photocurrent extracted from two-dimensional material layer 1 increases. Therefore, it is possible to improve the sensitivity of electromagnetic wave detector 100.

As shown in FIG. 16, buffer layer 5 has such a thickness that is capable of forming a tunnel current between the semiconductor 4 and two-dimensional material layer 1. Therefore, the photo carrier generated in semiconductor layer 4 is injected to two-dimensional material layer 1 through buffer layer 5. Since a large photocurrent is injected to graphene in the manner described above, it is possible to enhance the sensitivity of electromagnetic wave detector 100.

As shown in FIG. 16, plurality of control electrode parts 2c0 include ninth control electrode part 2c9. Ninth control electrode part 2c9 is connected to buffer layer 5 with second insulating film 3b and two-dimensional material layer 1 interposed therebetween. Therefore, by ninth control electrode part 2c9, it is possible to control the magnitude of the tunnel current in addition to the Fermi level of two-dimensional material layer 1. Also, by applying bias voltage V1, it is possible to enhance the magnitude of the tunnel current. As a result, it is possible to improve the sensitivity of electromagnetic wave detector 100.

Embodiment 8

Figure 17:
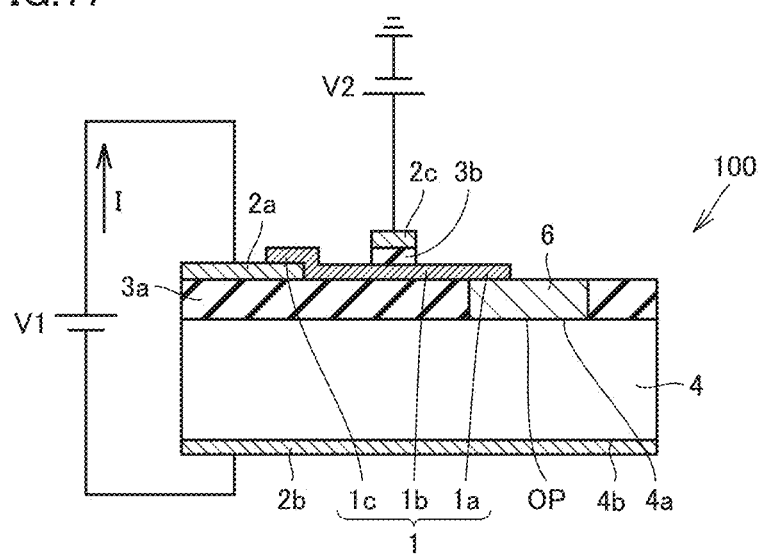
FIG. 17 is a section view schematically showing a configuration of an electromagnetic wave detector according to Embodiment 8.

Next, referring to FIG. 17, a configuration of electromagnetic wave detector 100 according to Embodiment 8 is described. Embodiment 8 has the same configuration, production method and operation and effect as Embodiment 3 unless otherwise described. Therefore, the same configuration as that in Embodiment 3 is denoted by the same reference numeral, and description thereof is not repeated.

As shown in FIG. 17, electromagnetic wave detector 100 according to the present embodiment further includes a connection conductor 6. Two-dimensional material layer 1 is electrically connected to semiconductor layer 4 with connection conductor 6 interposed therebetween. Connection conductor 6 is arranged inside opening OP. Connection conductor 6 is in contact with first insulating film 3a.

On the top face of connection conductor 6, two-dimensional material layer 1 is overlaid. The bottom face of connection conductor 6 is electrically connected to first surface 4a of semiconductor layer 4. Two-dimensional material layer 1 is electrically connected to the top face of connection conductor 6. The position of the top face of connection conductor 6 is the same as the position of the top face of first insulating film 3a. Two-dimensional material layer 1 extends planarly from the top face of first insulating film 3a onto the top face of connection conductor 6 without bending.

It is desired that connection conductor 6 is joined with semiconductor layer 4 by ohmic junction. Also, it is desired that connection conductor 6 has high transmissivity at a detection wavelength.

The material of connection conductor 6 is the same as those described for first electrode 2a, second electrode 2b and control electrode 2c. For example, when the material of semiconductor layer 4 is indium antimonide (InSb), the material of connection conductor 6 is desirably nickel (Ni) in consideration of the difference in Fermi level with respect to two-dimensional material layer 1.

The contact resistance between connection conductor 6 and two-dimensional material layer 1 is smaller than the contact resistance between two-dimensional material layer 1 and semiconductor layer 4. The contact resistance between connection conductor 6 and semiconductor layer 4 is smaller than contact resistance between two-dimensional material layer 1 and semiconductor layer 4. The sum of the contact resistance between connection conductor 6 and two-dimensional material layer 1 and the contact resistance between connection conductor 6 and semiconductor layer 4 is smaller than the contact resistance between two-dimensional material layer 1 and semiconductor layer 4.

The configuration of electromagnetic wave detector 100 according to Embodiment 8 may be applied to other embodiments.

Subsequently, operation and effect of the present embodiment is described.

According to electromagnetic wave detector 100 according to Embodiment 8, as shown in FIG. 17, two-dimensional material layer 1 is electrically connected to semiconductor layer 4 with connection conductor 6 interposed therebetween. The sum of the contact resistance between connection conductor 6 and two-dimensional material layer 1 and the contact resistance between connection conductor 6 and semiconductor layer 4 is smaller than the contact resistance between two-dimensional material layer 1 and semiconductor layer 4. Therefore, it is possible to reduce the contact resistance as compared with the case where two-dimensional material layer 1 and semiconductor layer 4 are directly joined. Also, since two-dimensional material layer 1 and semiconductor layer 4 are joined by Schottky junction, it is possible to suppress attenuation of photocurrent.

As shown in FIG. 17, the position of the top face of connection conductor 6 is the same as the position of the top face of first insulating film 3a. Accordingly, two-dimensional material layer 1 is formed horizontally without bending, so that the mobility of carrier in two-dimensional material layer 1 is improved. Since the photo-gating effect is proportional to the mobility, it is possible to improve the detection sensitivity of electromagnetic wave detector 100.

Embodiment 9

Next, referring to FIGS. 18 to 24, a configuration of electromagnetic wave detector 100 according to Embodiment 9 is described. Embodiment 9 has the same configuration, production method and operation and effect as Embodiment 3 unless otherwise described. Therefore, the same configuration as that in Embodiment 3 is denoted by the same reference numeral, and description thereof is not repeated.

Figure 18:
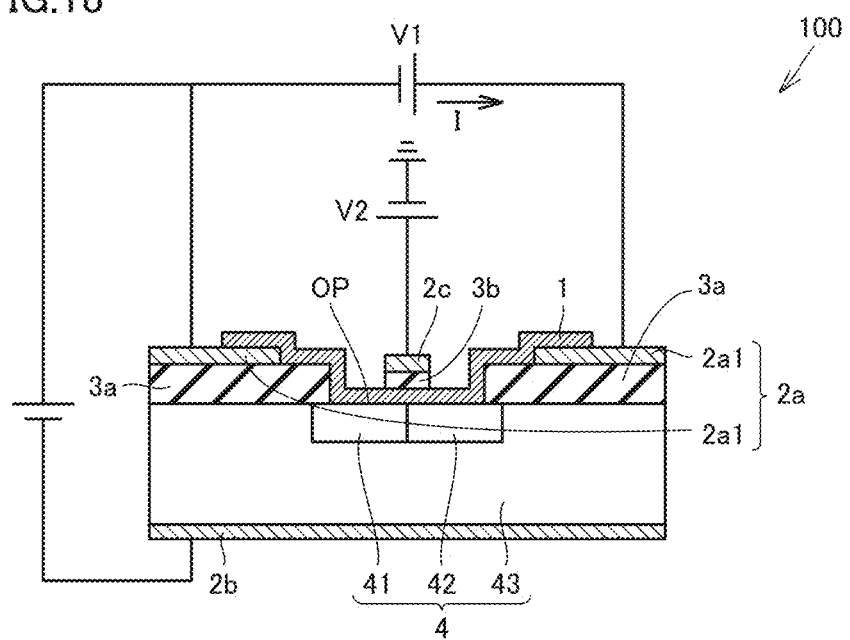
FIG. 18 is a section view schematically showing a configuration of an electromagnetic wave detector according to Embodiment 9.

As shown in FIG. 18, semiconductor layer 4 according to the present embodiment includes a first semiconductor part 41 and a second semiconductor part 42. Second semiconductor part 42 has a conductive type that is different from that of first semiconductor part 41. That is, first semiconductor part 41 and second semiconductor part 42 form a photo diode having mutually different conductive types. First semiconductor part 41 has a first conductive type. Second semiconductor part 42 has a second conductive type. The first conductive type is an opposite conductive type to the second conductive type. Therefore, the carrier doped to first semiconductor part 41 is different from the carrier doped to second semiconductor part 42.

First semiconductor part 41 is joined with second semiconductor part 42. First semiconductor part 41 is joined with second semiconductor part 42 directly under opening OP. Therefore, pn-junction is formed inside semiconductor layer 4.

Second semiconductor part 42 has an absorption wavelength that is different from that of first semiconductor part 41. The absorption wavelength of second semiconductor part 42 may be larger or smaller than the absorption wavelength of first semiconductor part 41. The absorption wavelength of second semiconductor part 42 may be partially the same as the absorption wavelength of first semiconductor part 41 unless it is perfectly the same as the absorption wavelength of first semiconductor part 41.

A tunnel diode may be used as semiconductor layer 4 including first semiconductor part 41 and second semiconductor part 42. Accordingly, a large photocurrent is generated only when an electromagnetic wave is applied to semiconductor layer 4. Therefore, a photocurrent is injected to two-dimensional material layer 1, and field change occurs in two-dimensional material layer 1. Accordingly, the sensitivity of electromagnetic wave detector 100 improves.

Semiconductor layer 4 may further include a third semiconductor part 43. Third semiconductor part 43 may have either of the first semiconductor type and the second semiconductor type. Third semiconductor part 43 is joined with at least either of first semiconductor part 41 and second semiconductor part 42. Desirably, third semiconductor part 43 is joined with both of first semiconductor part 41 and second semiconductor part 42. Third semiconductor part 43 may surround first semiconductor part 41 and second semiconductor part 42 along the in-plane direction of semiconductor layer 4.

First electrode 2a may include a pair of first electrode parts 2a1 arranged to sandwich opening OP therebetween. Each of pair of first electrode parts 2a1 is connected to first insulating film 3a.

Figure 19:
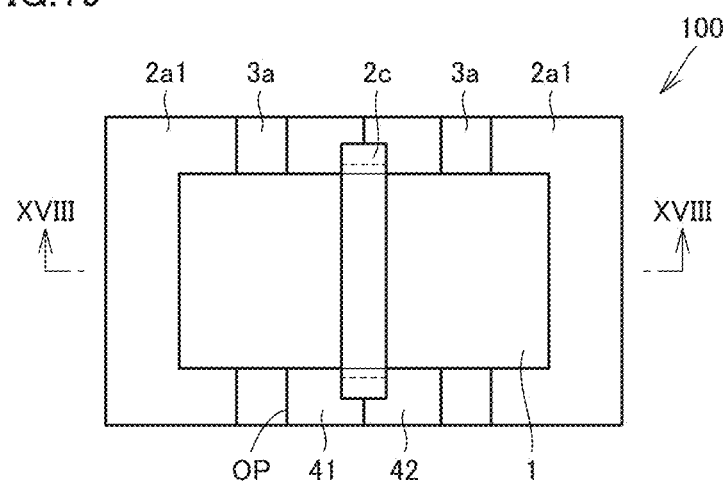
FIG. 19 is a top view schematically showing a configuration of an electromagnetic wave detector according to Embodiment 9.

As shown in FIG. 19, in opening OP, first semiconductor part 41 and second semiconductor part 42 are exposed from first insulating film 3a and the like. Accordingly, an electromagnetic wave is applied to first semiconductor part 41, second semiconductor part 42 and the junction interface between first semiconductor part 41 and second semiconductor part 42.

Figure 20:
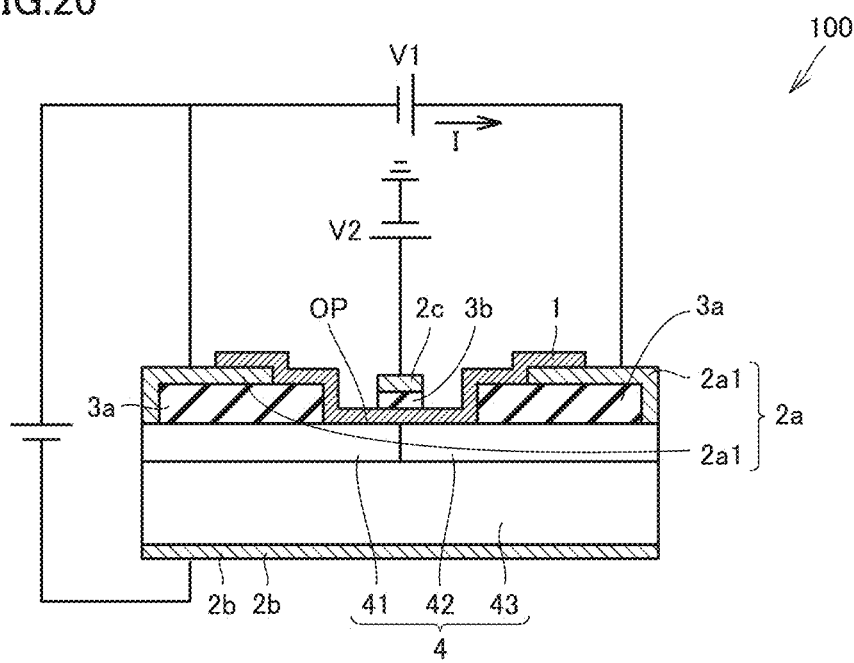
FIG. 20 is a section view schematically showing a configuration of an electromagnetic wave detector according to a first modified example of Embodiment 9.

Next, referring to FIG. 20, a configuration of a first modified example according to Embodiment 9 is described.

As shown in FIG. 20, first electrode 2a is connected to each of first semiconductor part 41 and second semiconductor part 42. Pair of first electrode parts 2a1 are connected respectively to first semiconductor part 41 and second semiconductor part 42. Therefore, bias voltage V1 is applied to each of first semiconductor part 41 and second semiconductor part 42 via first electrode 2a.

Figure 21:
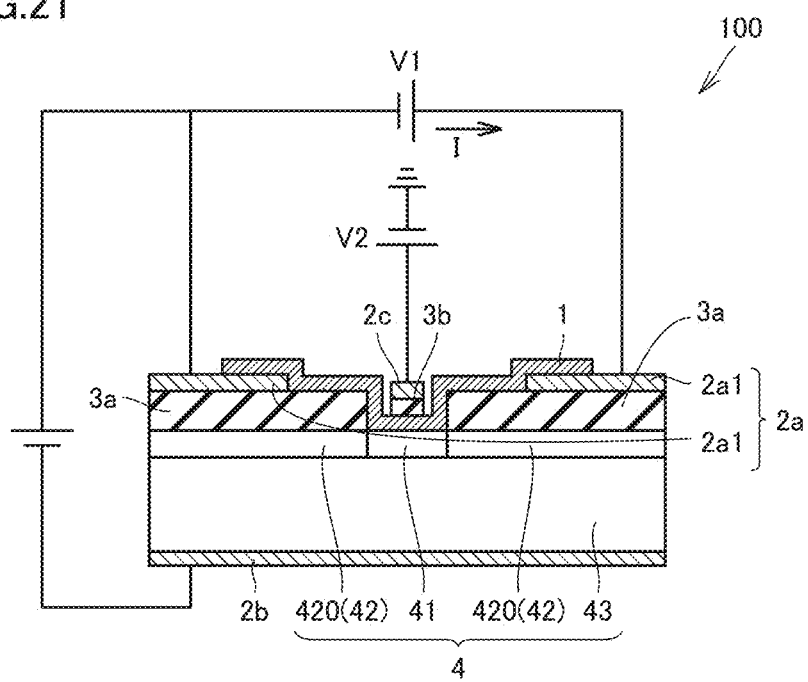
FIG. 21 is a section view schematically showing a configuration of an electromagnetic wave detector according to a second modified example of Embodiment 9.
Figure 22:
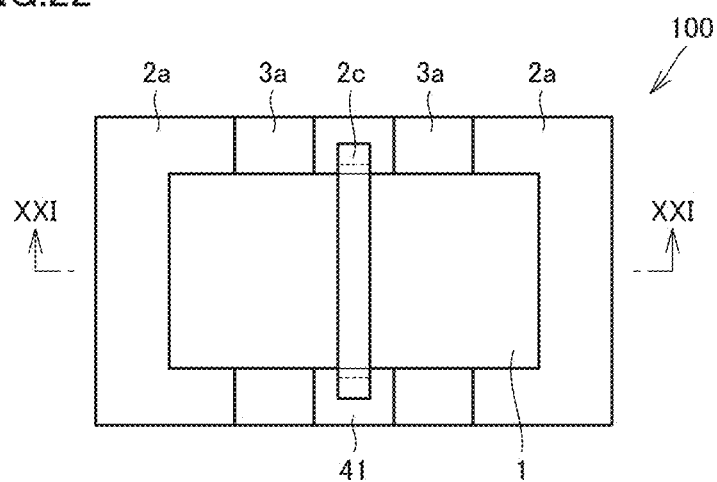
FIG. 22 is a top view schematically showing the configuration of the electromagnetic wave detector according to the second modified example of Embodiment 9.

Next, referring to FIGS. 21 and 22, a configuration of a second modified example according to Embodiment 9 is described.

As shown in FIGS. 21 and 22, second semiconductor part 42 includes a pair of second semiconductor portions 420. Pair of second semiconductor portions 420 sandwich first semiconductor part 41. Therefore, each of pair of second semiconductor portions 420 is joined with first semiconductor part 41. Therefore, two junctions are joined with first semiconductor part 41. Therefore, two pn-junctions are formed in first semiconductor part 41. Accordingly, semiconductor layer 4 is configured as one of a pnp photo resister and a npn photo resister.

Figure 23:
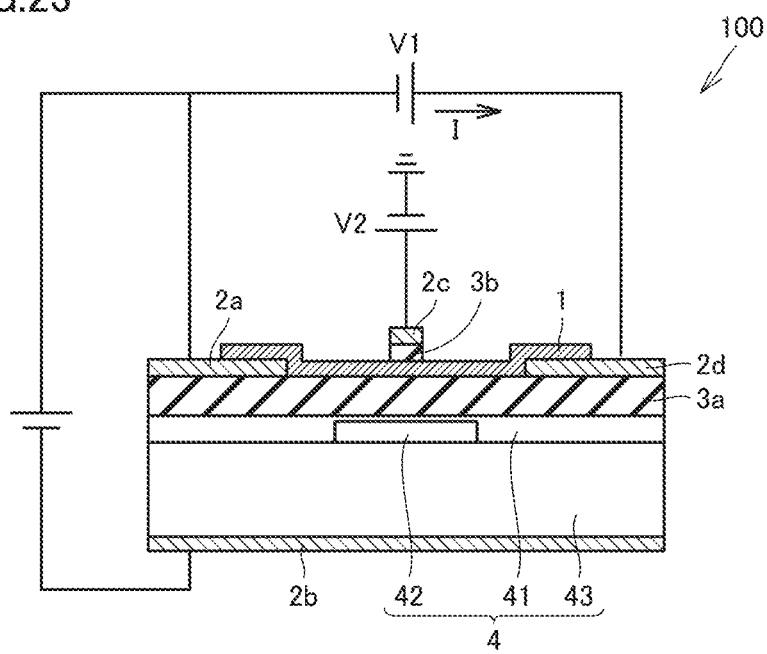
FIG. 23 is a section view schematically showing a configuration of an electromagnetic wave detector according to a third modified example of Embodiment 9.
Figure 24:
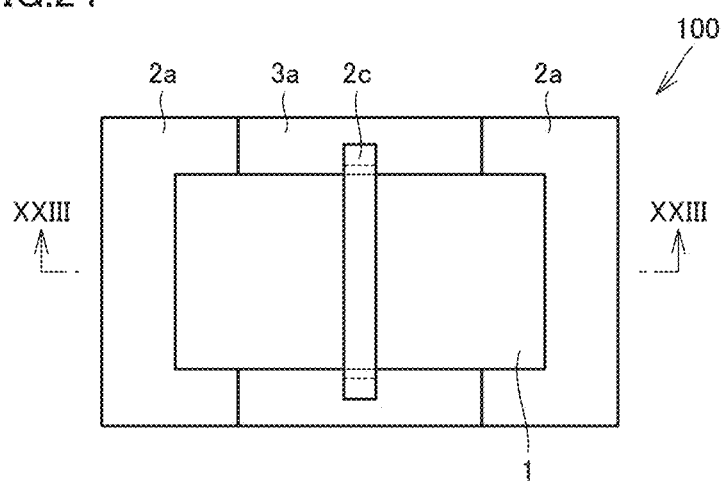
FIG. 24 is a top view schematically showing the configuration of the electromagnetic wave detector according to the third modified example of Embodiment 9.

Next, referring to FIGS. 23 and 24, a configuration of a third modified example according to Embodiment 9 is described.

As shown in FIG. 23, first semiconductor part 41 is joined with second semiconductor part 42 along the in-plane direction of semiconductor layer 4. Therefore, the junction interface extends along the in-plane direction of semiconductor layer 4. Second semiconductor part 42 is embedded in first semiconductor part 41. Two-dimensional material layer 1 is joined with second semiconductor part 42 with a thin part of first semiconductor part 41 interposed therebetween. The junction interface extends along the in-plane direction of semiconductor layer 4 directly under semiconductor layer 4. As shown in FIG. 24, second semiconductor part 42 is not exposed from first insulating film 3a.

The configuration of electromagnetic wave detector 100 according to Embodiment 9 may be applied to other embodiments.

Subsequently, operation and effect of the present embodiment is described.

According to electromagnetic wave detector 100 according to Embodiment 9, as shown in FIG. 18, first semiconductor part 41 is joined with second semiconductor part 42. Therefore, pn-junction is formed in semiconductor layer 4. Therefore, a photo carrier can be generated from pn-junction of semiconductor layer 4. The photo carrier generated in pn-junction can be extracted from two-dimensional material layer 1. The region arranged directly above the junction interface in semiconductor layer 4 is influenced by the localized field change in the junction interface between first semiconductor part 41 and second semiconductor part 42. As a result, the conductivity of two-dimensional material layer 1 varies, and the photo-gating effect is enhanced. Therefore, it is possible to improve the sensitivity of electromagnetic wave detector 100.

Second semiconductor part 42 has an absorption wavelength that is different from that of first semiconductor part 41. Accordingly, absorption wavelength of semiconductor layer 4 is broader compared with the case where semiconductor layer 4 is made up of one semiconductor part. Therefore, it is possible to broaden the band of detection wavelength of electromagnetic wave detector 100.

According to electromagnetic wave detector 100 according to a first modified example of Embodiment 9, as shown in FIG. 20, first electrode 2a is connected to each of first semiconductor part 41 and second semiconductor part 42. As a result, it is possible to apply voltage also to two-dimensional material layer 1 while applying voltage to each of first semiconductor part 41 and second semiconductor part 42. Therefore, it is possible to increase the depletion layer generated in first semiconductor part 41 and second semiconductor part 42, and hence it is possible to increase the photocurrent. Therefore, it is possible to improve the sensitivity of electromagnetic wave detector 100.

According to electromagnetic wave detector 100 according to a second modified example of Embodiment 9, as shown in FIG. 21, pair of second semiconductor portions 420 sandwich first semiconductor part 41. Therefore, the junction interface between first semiconductor part 41 and second semiconductor part 42 is larger as compared with the case where second semiconductor part 42 is made up of a single member. Also, the area in which the junction interface and two-dimensional material layer 1 come into contact with each other is larger as compared with the case where second semiconductor part 42 is made up of a single member. Therefore, it is possible to enlarge the influence of localized field change generated by application of an electromagnetic wave to semiconductor layer 4 on two-dimensional material layer 1. Therefore, it is possible to improve the sensitivity of electromagnetic wave detector 100.

As shown in FIG. 21, pair of second semiconductor portions 420 sandwich first semiconductor part 41. Accordingly, semiconductor layer 4 can be made to function as one of a npn photo resister and a pnp photo resister. Therefore, as the intensity of light applied to semiconductor layer 4 decreases, the resistance of first semiconductor part 41 and second semiconductor part 42 increases. Accordingly, only when light is applied to semiconductor layer 4, a photocurrent flows in first semiconductor part 41 and second semiconductor part 42. Therefore, it is possible to improve the sensitivity of electromagnetic wave detector 100 because field change occurs only when light is applied to semiconductor layer 4.

According to electromagnetic wave detector 100 according to a third modified example of Embodiment 9, as shown in FIG. 23, first semiconductor part 41 is joined with second semiconductor part 42 along the in-plane direction of semiconductor layer 4. Therefore, the junction interface between first semiconductor part 41 and second semiconductor part 42 extends along the in-plane direction of semiconductor layer 4. An electromagnetic wave is applied to semiconductor layer 4 from the direction intersecting the in-plane direction of semiconductor layer 4. Therefore, the intensity of the electromagnetic wave applied to the junction interface is larger than that in the case where the junction interface extends along the intersecting direction. Therefore, since the photocurrent increases, it is possible to improve the sensitivity of electromagnetic wave detector 100.

Embodiment 10

Figure 25:
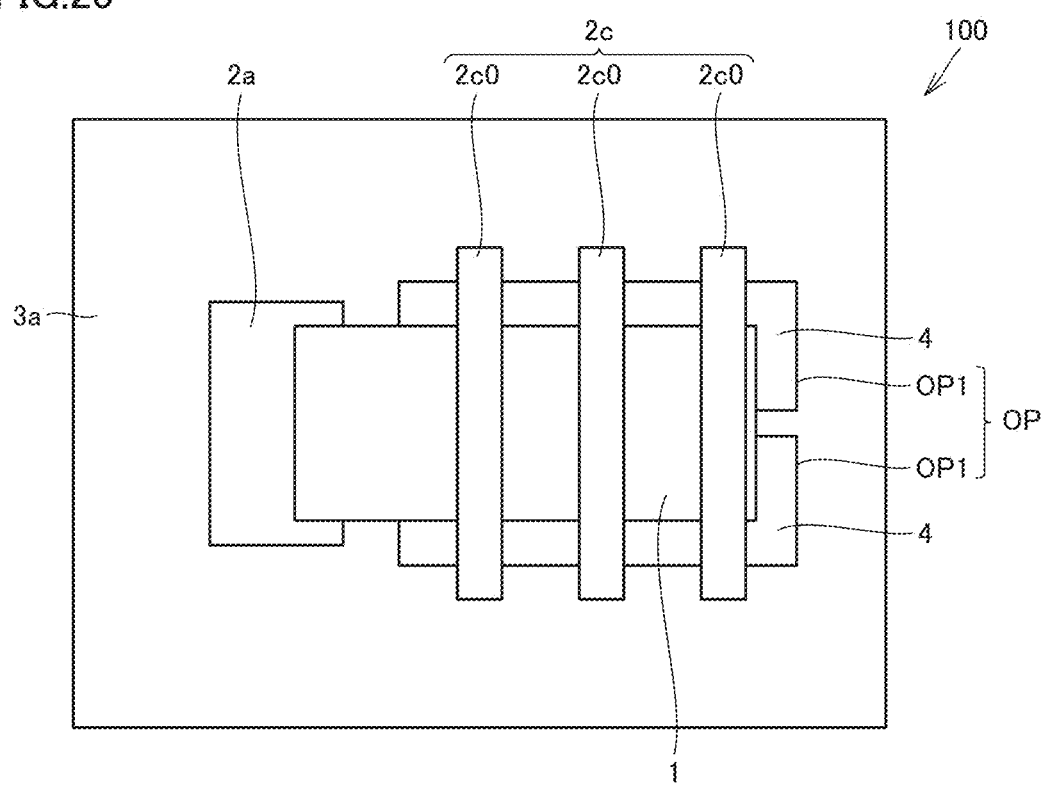
FIG. 25 is a top view schematically showing a configuration of an electromagnetic wave detector according to Embodiment 10.
Figure 26:
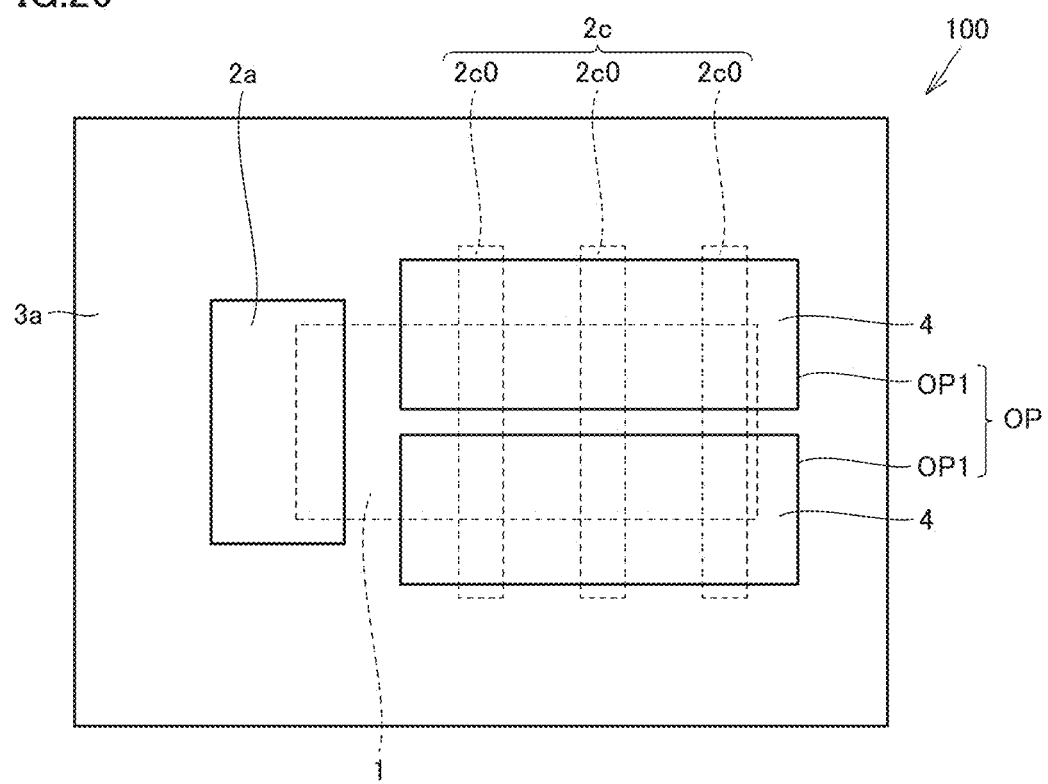
FIG. 26 is a top view schematically showing a configuration of a plurality of opening parts of the electromagnetic wave detector according to Embodiment 10.
Figure 27:
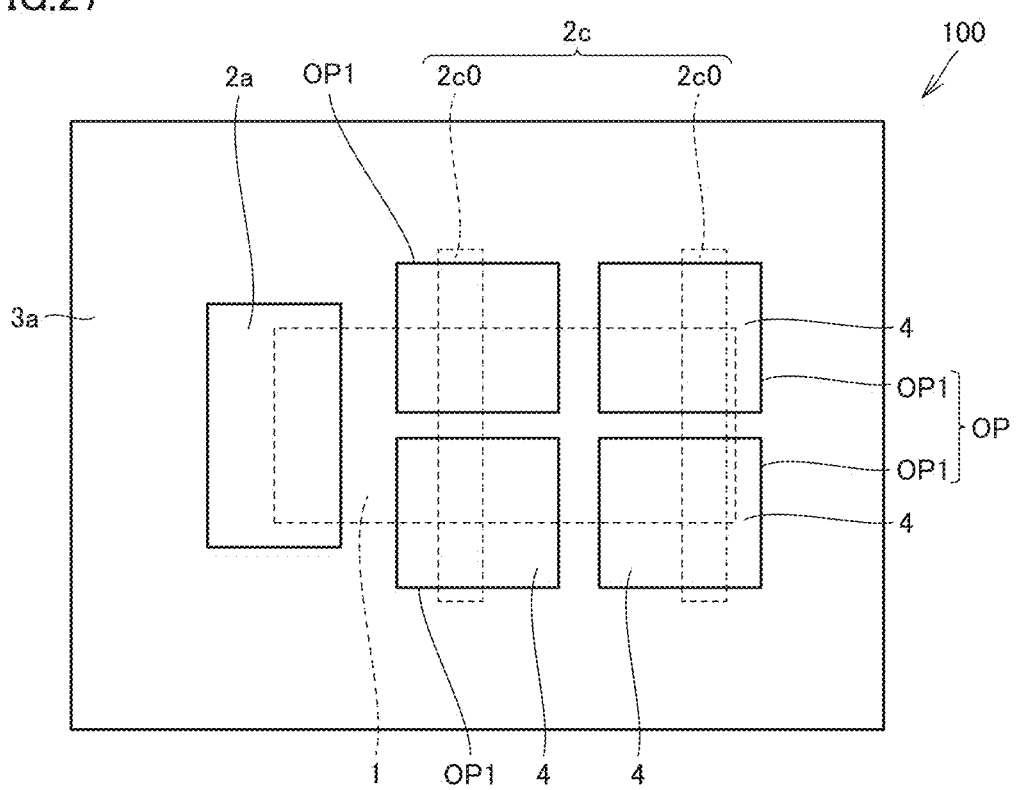
FIG. 27 is a top view schematically showing another configuration of the plurality of opening parts of the electromagnetic wave detector according to Embodiment 10.

Next, referring to FIGS. 25 to 27, a configuration of electromagnetic wave detector 100 according to Embodiment 10 is described. Embodiment 10 has the same configuration, production method and operation and effect as Embodiment 3 unless otherwise described. Therefore, the same configuration as that in Embodiment 3 is denoted by the same reference numeral, and description thereof is not repeated.

As shown in FIG. 25, in the present embodiment, opening OP includes a plurality of opening parts OP1 provided spaced apart from each other. For convenience of description, in FIG. 25, a broken line indicating bending of two-dimensional material layer 1 and control electrode 2c (see FIG. 1) is not illustrated. Two-dimensional material layer 1 is connected to semiconductor layer 4 in each of plurality of opening parts OP1. As shown in FIGS. 25 and 26, two opening parts OP1 may be provided. As shown in FIG. 27, four opening parts OP1 may be provided. In FIGS. 26 and 27, the outer shape of two-dimensional material layer 1 and the outer shape of control electrode 2c are indicated by broken lines.

The configuration of electromagnetic wave detector 100 according to Embodiment 10 may be applied to other embodiments.

Subsequently, operation and effect of the present embodiment is described.

According to electromagnetic wave detector 100 according to Embodiment 10, as shown in FIG. 25, two-dimensional material layer 1 is connected to semiconductor layer 4 in each of plurality of opening parts OP1. Therefore, two-dimensional material layer 1 comes into contact with semiconductor layer 4 at more positions as compared with the case where there is only one opening OP. Therefore, in the production step, it is possible to reduce the unevenness of the contact between two-dimensional material layer 1 and semiconductor layer 4. Therefore, it is possible to increase the performance of electromagnetic wave detector 100.

Embodiment 11

Figure 28:
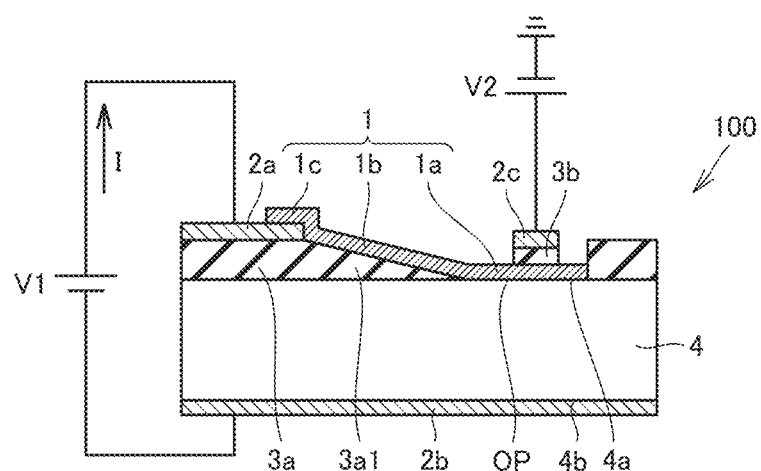
FIG. 28 is a section view schematically showing a configuration of an electromagnetic wave detector according to Embodiment 11.

Next, referring to FIG. 28, a configuration of electromagnetic wave detector 100 according to Embodiment 11 is described. Embodiment 11 has the same configuration, production method and operation and effect as Embodiment 3 unless otherwise described. Therefore, the same configuration as that in Embodiment 3 is denoted by the same reference numeral, and description thereof is not repeated.

As shown in FIG. 28, in the present embodiment, first insulating film 3a includes a taper part 3a1. Taper part 3al is configured such that the thickness varies as taper part 3al approaches opening OP from first electrode 2a. That is, first insulating film 3a is provided with a gradient. Taper part 3al is configured such that the thickness decreases as taper part 3al approaches opening OP from first electrode 2a. To taper part 3al, second part 1b of two-dimensional material layer 1 is directly connected.

Taper part 3al may be formed by depositing first insulating film 3a in the condition that semiconductor layer 4 is inclined. Taper part 3al may be formed by dry etching first insulating film 3a in the condition that semiconductor layer 4 is inclined. Taper part 3al is appropriately formed as long as the thickness varies as taper part 3al approaches opening OP from first electrode 2a.

The configuration of electromagnetic wave detector 100 according to Embodiment 11 may be applied to other embodiments.

Subsequently, operation and effect of the present embodiment is described.

According to electromagnetic wave detector 100 according to Embodiment 11, as shown in FIG. 28, taper part 3al is configured such that the thickness varies as taper part 3al approaches opening OP from first electrode 2a. Therefore, when an electromagnetic wave is applied to semiconductor layer 4, localized change occurs in the degree of field change inside two-dimensional material layer 1. That is, when an electromagnetic wave is applied to semiconductor layer 4, and field change is given to two-dimensional material layer 1, the degree of field change varies locally depending on the variation in thickness of first insulating film 3a. Accordingly, the mobility of carrier inside two-dimensional material layer 1 improves and the detection sensitivity of electromagnetic wave detector 100 improves.

Embodiment 12

Figure 29:
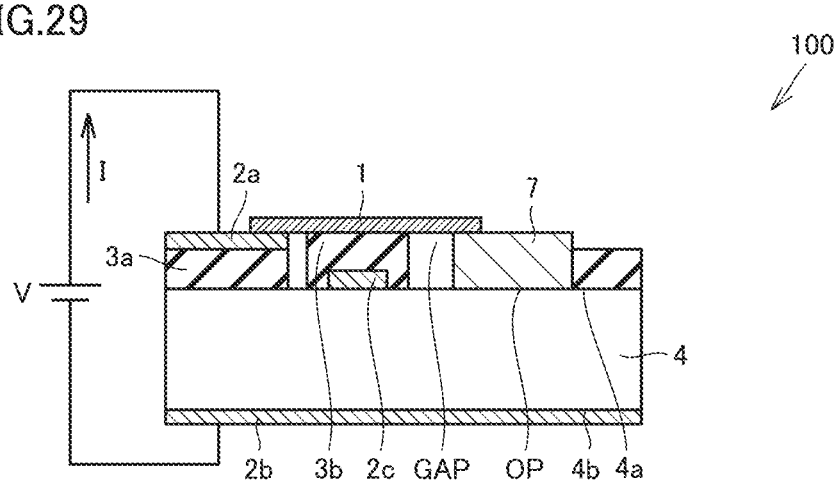
FIG. 29 is a section view schematically showing a configuration of an electromagnetic wave detector according to Embodiment 12.

Next, referring to FIG. 29, a configuration of electromagnetic wave detector 100 according to Embodiment 12 is described. Embodiment 12 has the same configuration, production method and operation and effect as Embodiment 3 unless otherwise described. Therefore, the same configuration as that in Embodiment 3 is denoted by the same reference numeral, and description thereof is not repeated.

In the present embodiment, a gap GAP is provided between first insulating film 3a and two-dimensional material layer 1. That is, the region corresponding to a channel region of two-dimensional material layer 1 is not in contact with first insulating film 3a, in contrast to electromagnetic wave detector 100 according to Embodiment 1. The size of gap GAP is such a size that a photo-gating effect is generated between two-dimensional material layer 1 and semiconductor layer 4.

Electromagnetic wave detector 100 may further include a connection part 7. Connection part 7 is arranged in opening OP. Two-dimensional material layer 1 is electrically connected to semiconductor layer 4 with connection part 7 interposed therebetween. The material of connection part 7 may be the same as the material of semiconductor layer 4, first electrode 2a, second electrode 2b or control electrode 2c. It is desired that the height of the top surface of connection part 7 is the same height of the top surface of first electrode 2a.

Two-dimensional material layer 1 extends from above first electrode 2a to above connection part 7. Other configuration may be employed as long as gap GAP is provided between the insulating film and two-dimensional material layer 1.

Second electrode 2b and second insulating film 3b according to the present embodiment have the same configurations as second electrode 2b and second insulating film 3b of Embodiment 2 shown in FIG. 8. Therefore, second electrode 2b is directly connected to semiconductor layer 4. Second insulating film 3b covers control electrode 2c. Also, two-dimensional material layer 1 covers semiconductor layer 4, first insulating film 3a and second insulating film 3b.

The configuration of electromagnetic wave detector 100 according to Embodiment 12 may be applied to other embodiments.

Subsequently, operation and effect of the present embodiment is described.

According to electromagnetic wave detector 100 according to Embodiment 12, as shown in FIG. 29, gap GAP is provided between first insulating film 3a and two-dimensional material layer 1. Therefore, it is possible to remove the influence of scattering of carrier associated with the contact between first insulating film 3a and two-dimensional material layer 1. As a result, it is possible to suppress deterioration in mobility of carrier in two-dimensional material layer 1. Therefore, it is possible to improve the sensitivity of electromagnetic wave detector 100. The photogating effect can operate even when gap GAP is provided under two-dimensional material layer 1.

Embodiment 13

Figure 30:
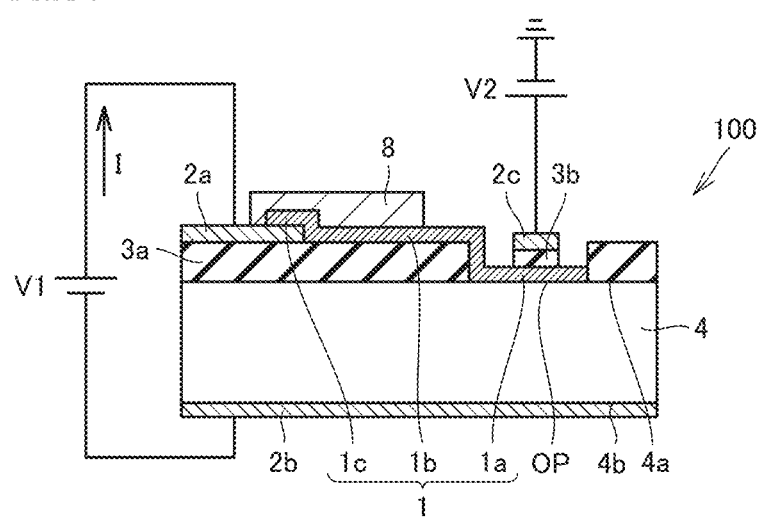
FIG. 30 is a section view schematically showing a configuration of an electromagnetic wave detector according to Embodiment 13.
Figure 31:
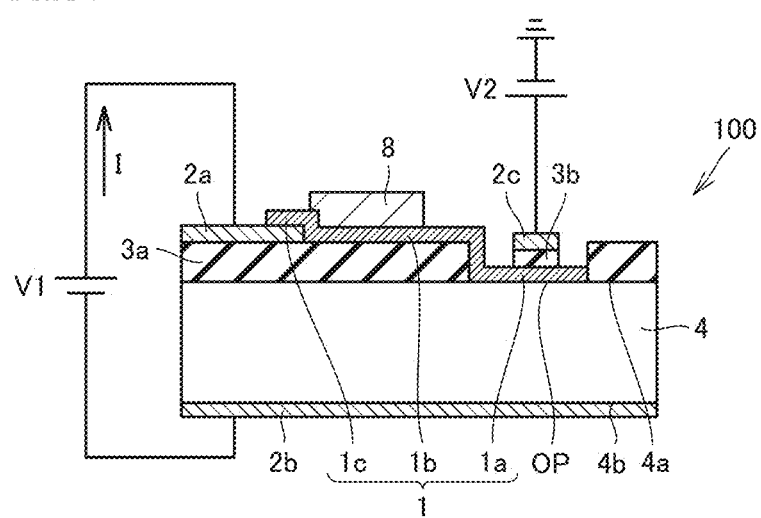
FIG. 31 is a section view schematically showing a configuration of an electromagnetic wave detector according to a modified example of Embodiment 13.

Next, referring to FIGS. 30 and 31, a configuration of electromagnetic wave detector 100 according to Embodiment 13 is described. Embodiment 13 has the same configuration, production method and operation and effect as Embodiment 3 unless otherwise described. Therefore, the same configuration as that in Embodiment 3 is denoted by the same reference numeral, and description thereof is not repeated.

As shown in FIG. 30, electromagnetic wave detector 100 according to the present embodiment further includes a contact layer 8. Contact layer 8 is arranged to be in contact with at least one of two-dimensional material layer 1 and first electrode 2a. Contact layer 8 is configured to supply two-dimensional material layer 1 with holes or electrons (photo carrier) by coming into contact with one of two-dimensional material layer 1 and first electrode 2a. That is, contact layer 8 is configured to dope two-dimensional material layer 1 with holes or electrons.

While contact layer 8 is in contact with first electrode 2a in FIG. 30, contact layer 8 may not be in contact with first electrode 2a as shown in FIG. 31. Contact layer 8 may be arranged such that it is in contact with at least one of two-dimensional material layer 1 and first electrode 2a, but is not in contact with the other of two-dimensional material layer 1 and first electrode 2a.

Although not illustrated, plurality of contact layers 8 may be laminated on two-dimensional material layer 1. Plurality of contact layers 8 may be formed on two-dimensional material layer 1 between first electrode 2a and semiconductor layer 4. Respective materials of plurality of contact layers 8 may be the same or different from each other.

The material of contact layer 8 is, for example, a positive-type photoresist. A positive-type photoresist is a composition containing a photosensitizer having a quinone diazide group, and novolac resin. The material of contact layer 8 may be for example, a material having a polar group. More specifically, the material of contact layer 8 may be a material having an electron-attracting group, which is one example of the material having a polar group. The material having an electron-attracting group has the effect of reducing the electron density of two-dimensional material layer 1. Also, the material of contact layer 8 may be, for example, a material having an electron-donating group, which is one example of the material having a polar group. The material having an electron-donating group has the effect of increasing the electron density of two-dimensional material layer 1.

The material of contact layer 8 may be an inorganic substance, an organic substance, metal, a semiconductor, an insulator, a two-dimensional material or a mixture of any of these materials as long as polarization of charges occurs and polarity is generated in the entire molecule.

When the material of contact layer 8 is an inorganic substance, two-dimensional material layer 1 is doped to p-type if the work function of contact layer 8 is larger than the work function of two-dimensional material layer 1. When the material of contact layer 8 is an inorganic substance, two-dimensional material layer 1 is doped to n-type if the work function of contact layer 8 is smaller than the work function of two-dimensional material layer 1. When the material of contact layer 8 is an organic substance, the organic substance does not have a definite work function. Therefore, it is desired to determine to which one of n-type and p-type two-dimensional material layer 1 is to be doped by determining the polar group of the material of contact layer 8 according to the polarity of the molecule of the organic substance constituting the material of contact layer 8.

For example, when a positive-type photoresist is used as contact layer 8, the region where a resist is formed by photolithography step in two-dimensional material layer 1 becomes a p-type two-dimensional material layer region. Accordingly, the treatment of forming a mask contacting on the surface of two-dimensional material layer 1 is no longer required. As a result, it is possible to suppress injury of two-dimensional material layer 1 by the process of forming a mask. Also, it is possible to simplify the production method.

The material of contact layer 8 may be a material in which polarity conversion occurs by application of an electromagnetic wave to contact layer 8. By occurrence of polarity conversion in contact layer 8, electrons or holes generated at the time of polarity conversion are supplied to two-dimensional material layer 1. Therefore, the part of two-dimensional material layer 1 being in contact with contact layer 8 is doped with electrons or holes. Therefore, after removal of contact layer 8, the part of two-dimensional material layer 1 having been in contact with contact layer 8 remains in the condition it is doped with electrons or holes. Therefore, when a material in which polarity conversion occurs is used as the material of contact layer 8, contact layer 8 may be removed from on two-dimensional material layer 1 after occurrence of polarity conversion. The area of the open part of two-dimensional material layer 1 increases compared with the case where contact layer 8 is arranged. Therefore, it is possible to improve the detection sensitivity of electromagnetic wave detector 100. Polarity conversion is a phenomenon that a polar group chemically converts, and means, for example, the phenomenon such as conversion from an electron-attracting group to an electron-donating group, conversion from an electron-donating group to an electron-attracting group, conversion from a polar group to a non-polar group, or conversion from a non-polar group to a polar group.

By selecting a material in which polarity conversion occurs at a detection wavelength as the material of contact layer 8, polarity conversion occurs in contact layer 8 only when an electromagnetic wave having the detection wavelength is applied. Accordingly, doping to two-dimensional material layer 1 is conducted only when an electromagnetic wave having a detection wavelength is applied. As a result, it is possible to increase the photocurrent flowing into two-dimensional material layer 1.

Also, the material of contact layer 8 may be a material in which oxidation-reduction reaction occurs by application of an electromagnetic wave to contact layer 8. Accordingly, it is possible to dope two-dimensional material layer 1 with electrons or holes generated when oxidation-reduction reaction occurs in contact layer 8.

It is preferred that the film thickness of contact layer 8 is small enough to conduct photoelectric conversion when an electromagnetic wave is applied to two-dimensional material layer 1. On the other hand, it is preferred that contact layer 8 is formed to have such a degree of thickness that a carrier is doped to two-dimensional material layer 1 from contact layer 8.

Configuration of contact layer 8 may be appropriately determined as long as a carrier such as a molecule or an electron is supplied to two-dimensional material layer 1. For example, by dipping two-dimensional material layer 1 in a solution, and supplying two-dimensional material layer 1 with a carrier in a molecular level, two-dimensional material layer 1 may be doped with the carrier without formation of solid contact layer 8 on two-dimensional material layer 1.

The configuration of electromagnetic wave detector 100 according to Embodiment 13 may be applied to other embodiments.

Subsequently, operation and effect of the present embodiment is described.

According to electromagnetic wave detector 100 according to Embodiment 13, as shown in FIG. 30, contact layer 8 is arranged such that it is in contact with at least one of two-dimensional material layer 1 and first electrode 2a. Contact layer 8 is configured such that it supplies two-dimensional material layer 1 with holes or electrons by coming into contact with at least one of two-dimensional material layer 1 and first electrode 2a. Therefore, the conductive type of two-dimensional material layer 1 can be a n-type or a p-type. Accordingly, even when a photo carrier is doped from first electrode 2a and semiconductor layer 4 to two-dimensional material layer 1, the conductive type of two-dimensional material layer 1 can be controlled. Therefore, it is possible to improve the performance of electromagnetic wave detector 100.

Contact layer 8 may be arranged such that it is in contact with at least one of two-dimensional material layer 1 and first electrode 2a, but is not in contact with the other of two-dimensional material layer 1 and first electrode 2a. In FIG. 31, contact layer 8 is arranged so that it is in contact with two-dimensional material layer 1, but is not in contact with first electrode 2a. Accordingly, a gradient of charge density is formed in two-dimensional material layer 1, and hence the mobility of two-dimensional material layer 1 improves. Therefore, it is possible to improve the sensitivity of electromagnetic wave detector 100.

Embodiment 14

Figure 32:
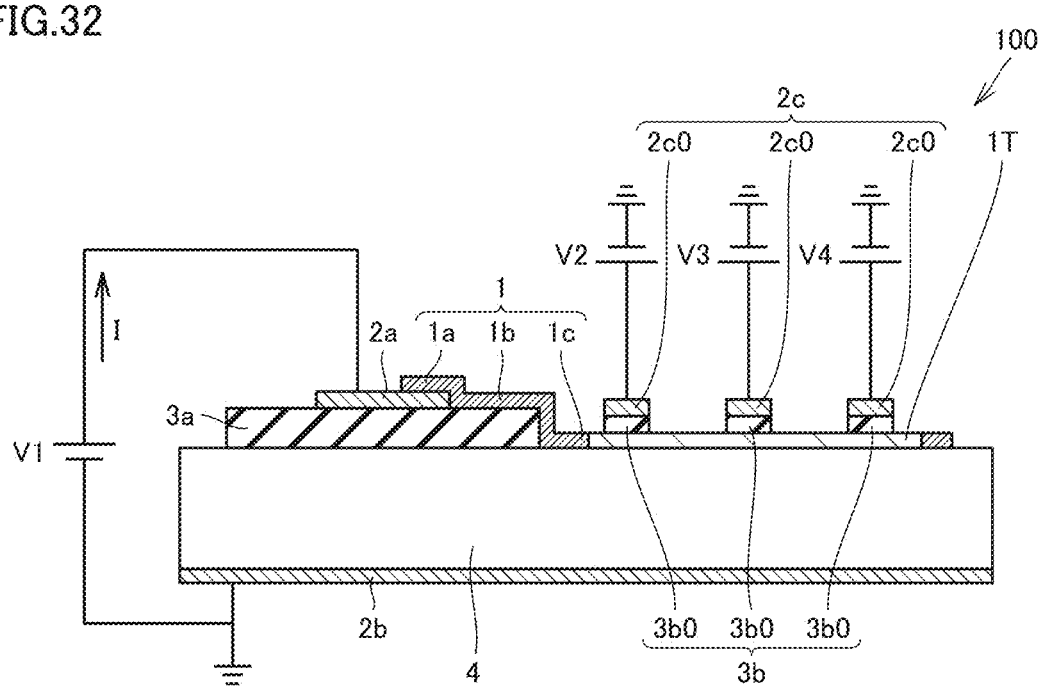
FIG. 32 is a section view schematically showing a configuration of an electromagnetic wave detector according to Embodiment 14.

Next, referring to FIG. 32, a configuration of electromagnetic wave detector 100 according to Embodiment 14 is described. Embodiment 14 has the same configuration, production method and operation and effect as Embodiment 3 unless otherwise described. Therefore, the same configuration as that in Embodiment 3 is denoted by the same reference numeral, and description thereof is not repeated.

As shown in FIG. 32, two-dimensional material layer 1 according to the present embodiment includes a turbostratic structure part 1T. Turbostratic structure part 1T is a structure in which a plurality of graphene layers are laminated in the state that respective lattices of the plurality of graphene layers are mismatched. Two-dimensional material layer 1 may include turbostratic structure part 1T as a part of two-dimensional material layer 1, or the entire two-dimensional material layer 1 may be configured by turbostratic structure part 1T. The material of two-dimensional material layer 1 according to the present embodiment is multilayer graphene.

A method for preparing turbostratic structure part 1T may be appropriately determined. For example, turbostratic structure part 1T may be formed by transferring monolayer graphene prepared by the CVD method several times to laminate into multilayer graphene. Also, turbostratic structure part 1T may be formed by arranging a carbon source such as ethanol, methane or the like on graphene, and growing the graphene by the CVD method.

The configuration of electromagnetic wave detector 100 according to Embodiment 14 may be applied to other embodiments.

Subsequently, operation and effect of the present embodiment is described.

According to electromagnetic wave detector 100 according to Embodiment 14, as shown in FIG. 32, two-dimensional material layer 1 includes turbostratic structure part 1T. Therefore, it is possible to improve the mobility of carrier in two-dimensional material layer 1. Therefore, it is possible to improve the sensitivity of electromagnetic wave detector 100.

More specifically, normal multilayer graphene that does not include turbostratic structure part 1T is laminated in the state that respective lattices of plurality of graphenes are matched. This state is called A-B multilayer. Meanwhile, multilayer graphene including turbostratic structure part 1T is formed in the following manner. Graphene prepared by the CVD method has polycrystals. Therefore, when graphene is further transferred on the graphene plural times, or when graphene is further laminated by the CVD method with the underlying graphene being as a core, lamination is performed in the state that respective lattices of plurality of graphenes are mismatched. That is, turbostratic structure part 1T is formed in graphene. Graphene of the turbostratic structure constituting turbostratic structure part 1T is less influenced by the interaction between layers, and has the equivalent properties as monolayer graphene. Further, in two-dimensional material layer 1, the mobility deteriorates due to the influence of carrier scattering in the underlying insulating film. However, in turbostratic structure part 1T, the graphene being in contact with the insulating film is influenced by carrier scattering, but the graphene of the upper layer laminated in the turbostratic structure on the graphene is less likely to be influenced by carrier scattering of the underlying insulating film. Also, in the graphene of the turbostratic structure, since the influence of the interaction between layers is small, the conductivity also improves. Based on the above, the mobility of carrier improves in the graphene of the turbostratic structure. As a result, it is possible to improve the sensitivity of electromagnetic wave detector 100.

Embodiment 15

Next, a configuration of electromagnetic wave detector 100 according to Embodiment 15 is described. Electromagnetic wave detector 100 according to the present embodiment has the same structure as electromagnetic wave detector 100 according to Embodiment 13 shown in FIG. 30 except for the materials of first insulating film 3a, second insulating film 3b, semiconductor layer 4 and contact layer 8. Embodiment 15 has the same configuration, production method and operation and effect as Embodiment 13 unless otherwise described. Therefore, the same configuration as that in Embodiment 13 is denoted by the same reference numeral, and description thereof is not repeated.

Electromagnetic wave detector 100 according to the present embodiment includes contact layer 8. The material of at least one of first insulating film 3a, second insulating film 3b, semiconductor layer 4 and contact layer 8 according to the present embodiment is a material that provides two-dimensional material layer 1 with variation in potential due to change in characteristics by application of an electromagnetic wave.

The material that provides two-dimensional material layer 1 with variation in potential due to change in characteristics by application of an electromagnetic wave is, for example, a ferroelectric material, a rare earth oxide or the like in first insulating film 3a and second insulating film 3b. The material that provides two-dimensional material layer 1 with variation in potential due to change in characteristics by application of an electromagnetic wave is, for example, the above-described semiconductor material, a pn-junction material, a structure in which metal and semiconductor are joined, a structure in which metal, insulator and semiconductor junction material are joined, perovskite or the like in semiconductor layer 4. The material that provides two-dimensional material layer 1 with variation in potential due to change in characteristics by application of an electromagnetic wave is, for example, a quantum dot, a liquid crystal material, fullerene, perovskite or the like in contact layer 8.

For example, when a ferroelectric material having a polarization effect (pyroelectric effect) by an electromagnetic wave is used as the ferroelectric material, change in polarization occurs in the ferroelectric material by application of an electromagnetic wave to the ferroelectric material. As a result, variation in potential occurs in two-dimensional material layer 1.

While the description has been made for the exemplary cases where the material that provides two-dimensional material layer 1 with variation in potential due to change in characteristics by application of an electromagnetic wave is applied to first insulating film 3a, second insulating film 3b, semiconductor layer 4 and contact layer 8, it suffices that the material is applied to at least one of the aforementioned members. For example, when the material that provides two-dimensional material layer 1 with variation in potential due to change in characteristics by application of an electromagnetic wave is applied to contact layer 8, contact layer 8 is not necessarily in direct contact with two-dimensional material layer 1. Contact layer 8 may be provided on the top face or the bottom face of two-dimensional material layer 1 with an unillustrated insulating film or the like interposed therebetween as long as two-dimensional material layer 1 is provided with variation in potential.

The configuration of electromagnetic wave detector 100 according to Embodiment 15 may be applied to other embodiments.

Subsequently, operation and effect of the present embodiment is described.

According to electromagnetic wave detector 100 according to Embodiment 15, as shown in FIG. 30, the material of at least one of first insulating film 3a, second insulating film 3b, semiconductor layer 4 and contact layer 8 according to the present embodiment is a material that provides two-dimensional material layer 1 with variation in potential due to change in characteristics by application of an electromagnetic wave. Therefore, by applying an electromagnetic wave to at least one of first insulating film 3a, second insulating film 3b, contact layer 8 and semiconductor layer 4, it is possible to vary the potential of two-dimensional material layer 1.

Embodiment 16

Figure 33:
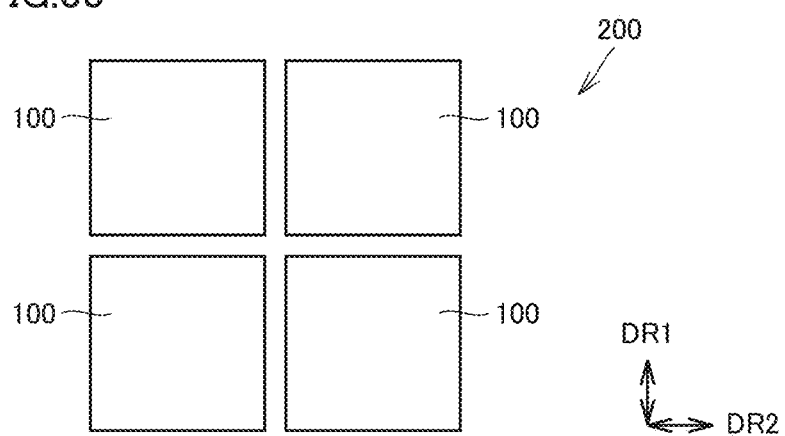
FIG. 33 is a top view schematically showing a configuration of an electromagnetic wave detector assembly according to Embodiment 16.
Figure 34:
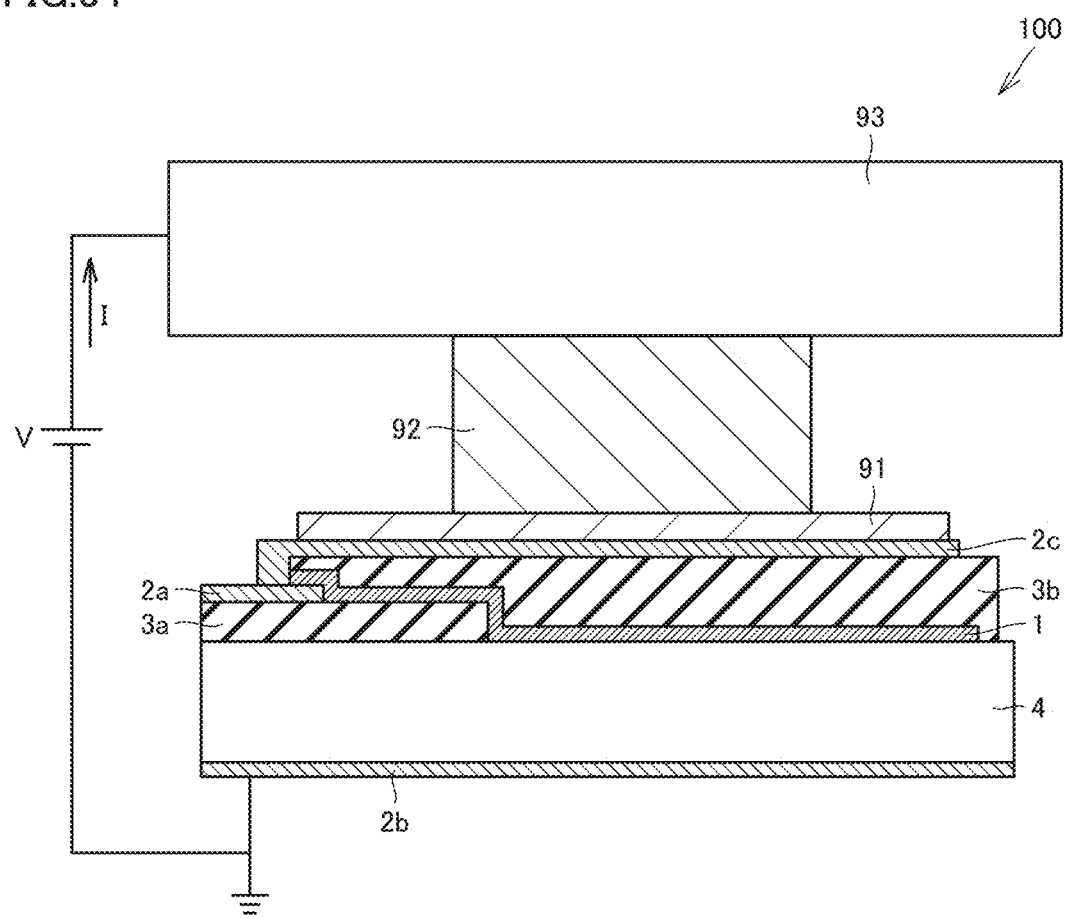
FIG. 34 is a section view schematically showing a configuration of one electromagnetic wave detector of a plurality of electromagnetic wave detectors included in the electromagnetic wave detector assembly of Embodiment 16, a pad, a bump, and a readout circuit.

Next, referring to FIGS. 33 and 34, a configuration of an electromagnetic wave detector assembly 200 according to Embodiment 16 is described.

As shown in FIG. 33, electromagnetic wave detector assembly 200 according to the present embodiment has a plurality of electromagnetic wave detectors 100 according to Embodiments 1 to 14 and later-described Embodiment 17. The plurality of electromagnetic wave detectors 100 are arranged in line along at least one of a first direction DR1 and a second direction DR2 intersecting first direction DR1. In the present embodiment, plurality of electromagnetic wave detectors 100 included in electromagnetic wave detector assembly 200 are electromagnetic wave detectors 100 that are the same with each other.

When respective semiconductor layers 4 (see FIG. 1) of plurality of electromagnetic wave detectors 100 are separated from each other, one second electrode 2b (see FIG. 1) may be used as a common electrode in plurality of electromagnetic wave detectors 100. Accordingly, it is possible to reduce the wiring of electromagnetic wave detector assembly 200, and it is possible to enhance the resolution of electromagnetic wave detector assembly 200. Respective semiconductor layers 4 (see FIG. 1) of plurality of electromagnetic wave detectors 100 are separated from each other, for example, by providing a trench structure on the outer periphery of semiconductor layer 4 (see FIG. 1). Control electrode 2c may be common to first electrode 2a.

While four electromagnetic wave detectors 100 are arranged in a 2×2 matrix in electromagnetic wave detector assembly 200 shown in FIG. 33, the number of arranged electromagnetic wave detectors 100 is not limited to this. In electromagnetic wave detector assembly 200 shown in FIG. 33, plurality of electromagnetic wave detectors 100 are arranged two-dimensionally and periodically, however, plurality of electromagnetic wave detectors 100 may be arranged periodically along one direction. Among plurality of electromagnetic wave detectors 100, intervals between neighboring electromagnetic wave detectors 100 may be equivalent or different from each other.

Also, as shown in FIG. 34, electromagnetic wave detector assembly 200 may include a readout circuit 93 configured to read out a signal from electromagnetic wave detector 100. Electromagnetic wave detector 100 may be arranged on readout circuit 93. A readout format of readout circuit 93 is, for example, CTIA (Capacitive Transimpedance Amplifier) format. Readout circuit 93 may be of other readout format.

Also, electromagnetic wave detector assembly 200 may include a bump 92 that electrically connects electromagnetic wave detector 100 and readout circuit 93. The structure in which electromagnetic wave detector 100 and readout circuit 93 are connected by bump 92 is called hybrid junction. Hybrid junction is a common structure in a quantum infrared sensor. Bump 92 and electromagnetic wave detector 100 are electrically connected by a pad 91 provided on control electrode 2c. The material of bump 92 is, for example, a conductive material such as indium (Ib). The material of pad 91 is a conductive material such as aluminum silicon (Al—Si) based alloy, nickel (Ni), gold (Au) and the like.

Figure 35:
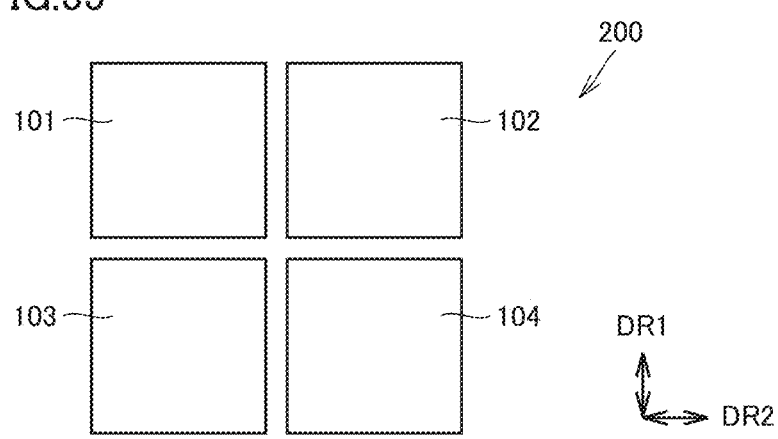
FIG. 35 is a top view schematically showing a configuration of an electromagnetic wave detector assembly according to a modified example of Embodiment 16.

Next, referring to FIG. 35, a configuration of a modified example of electromagnetic wave detector assembly 200 according to Embodiment 16 is described.

As shown in FIG. 35, plurality of electromagnetic wave detectors included in electromagnetic wave detector assembly 200 are electromagnetic wave detectors 101 to 104 that are different from each other. Electromagnetic wave detectors 101 to 104 that are different from each other are arranged in an array (in matrix). Plurality of electromagnetic wave detectors 101 to 104 may respectively have detection wavelengths that are different from each other. Specifically, plurality of electromagnetic wave detectors 101 to 104 may respectively have detection wavelength selectivities that are different from each other. Also, plurality of electromagnetic wave detectors 101 to 104 may be respectively configured to detect electromagnetic waves having polarizations that are different from each other.

Semiconductor materials forming respective semiconductor layers 4 (see FIG. 1) of plurality of electromagnetic wave detectors 101 to 104 may have detection wavelengths that are different from each other. For example, a semiconductor material of which detection wavelength is a wavelength of visible light, and a semiconductor material of which detection wavelength is a wavelength of infrared may may be used. For example, when electromagnetic wave detector assembly 200 is applied to a vehicle-mounted sensor, electromagnetic wave detector assembly 200 can be used as a camera for visible light image during daytime. Further, electromagnetic wave detector assembly 200 can be used as an infrared camera during nighttime. With such a configuration, it is no longer necessary to use different cameras according to the detection wavelength of the electromagnetic wave.

Subsequently, operation and effect of the present embodiment is described.

According to electromagnetic wave detector assembly 200 according to Embodiment 16, as shown in FIG. 33, electromagnetic wave detector assembly 200 has plurality of electromagnetic wave detectors 100 according to Embodiments 1 to 14. Therefore, by setting each of plurality of electromagnetic wave detectors 100 as a detection element, it is possible to make electromagnetic wave detector assembly 200 have a function as an image sensor.

According to a modified example of electromagnetic wave detector assembly 200 according to Embodiment 16, as shown in FIG. 35, plurality of electromagnetic wave detectors 101 to 104 respectively have detection wavelengths that are different from each other. Therefore, electromagnetic wave detector assembly 200 is capable of detecting at least two or more electromagnetic waves having different wavelengths.

In this manner, electromagnetic wave detector assembly 200 is capable of discriminating wavelengths of electromagnetic waves in any wave ranges, for example, wave ranges of ultraviolet light, infrared light, terahertz wave, radio wave and the like in the same manner as an image sensor used in visible light range. As a result, it is possible to obtain, for example, a colored image in which difference in wavelength is shown as difference in color.

Also, electromagnetic wave detector assembly 200 can be used, for example, as a position detecting sensor capable of detecting the position of an object even with a small number of pixels. Also, for example, electromagnetic wave detector assembly 200 can be used as an image sensor capable of detecting intensity of an electromagnetic wave at a plurality of wavelengths. Accordingly, it is possible to detect a plurality of electromagnetic waves and obtain a colored image without using a color filter that has been conventionally required in CMOS (complementary MOS) sensor or the like.

Plurality of electromagnetic wave detectors 101 to 104 are respectively configured to detect electromagnetic waves having polarizations that are different from each other. Accordingly, it is possible to make electromagnetic wave detector assembly 200 have a function as a polarization discriminating image sensor. For example, by arranging plurality of electromagnetic wave detectors 100 of one unit consisting of four pixels whose polarization angles to be sensed are 0°, 90°, 45°, and 1350, polarization imaging is enabled. The polarization discriminating image sensor enables, for example, discrimination between artifact and natural object, discrimination of material, discrimination of plurality of objects having the same temperature in infrared wave range, discrimination of boundary between a plurality of objects, or improvement in equivalent resolution.

As described above, electromagnetic wave detector assembly 200 is capable of detecting electromagnetic waves of a broad wave range. Also, electromagnetic wave detector assembly 200 is capable of detecting electromagnetic waves of different wavelengths.

Embodiment 17

Figure 36:
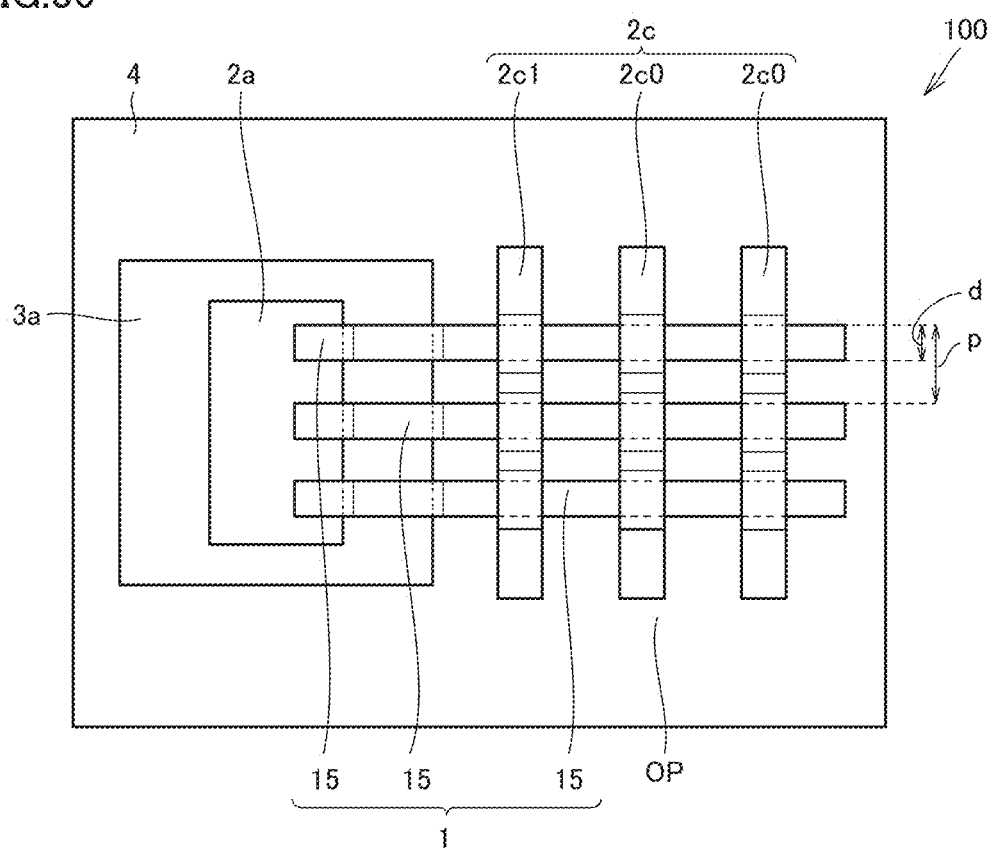
FIG. 36 is a top view schematically showing a configuration of an electromagnetic wave detector according to Embodiment 17.
Figure 37:
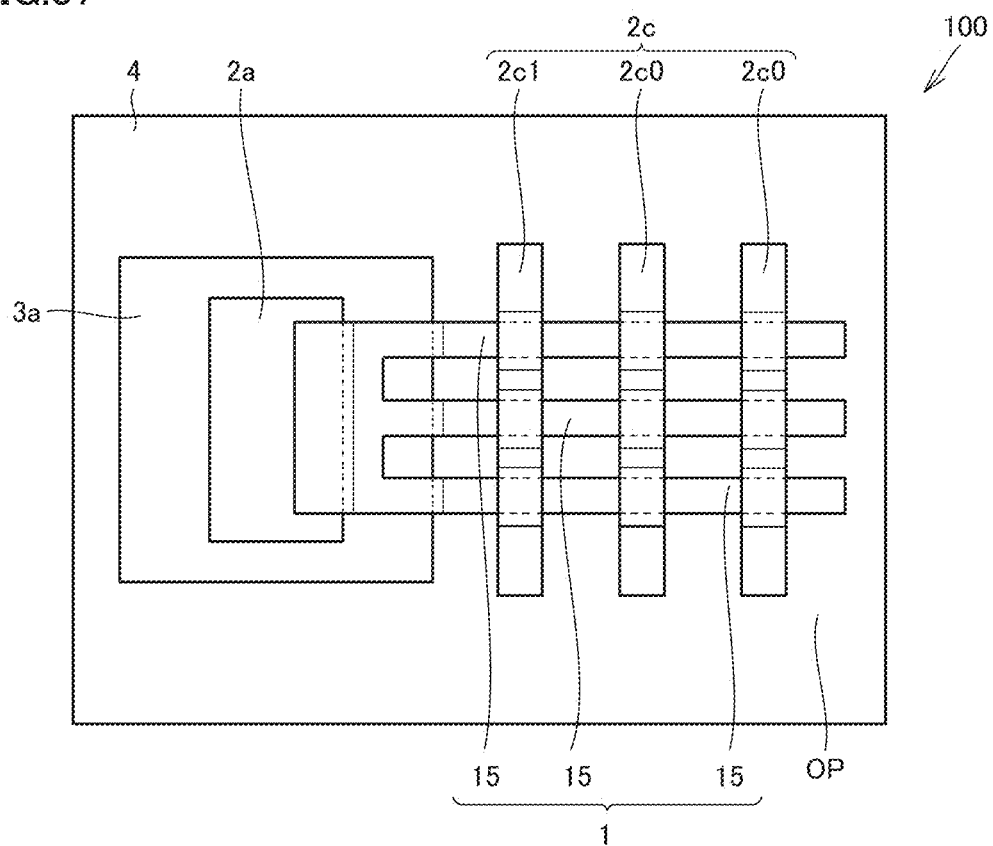
FIG. 37 is a top view schematically showing a configuration of an electromagnetic wave detector according to a first modified example of Embodiment 17.
Figure 38:
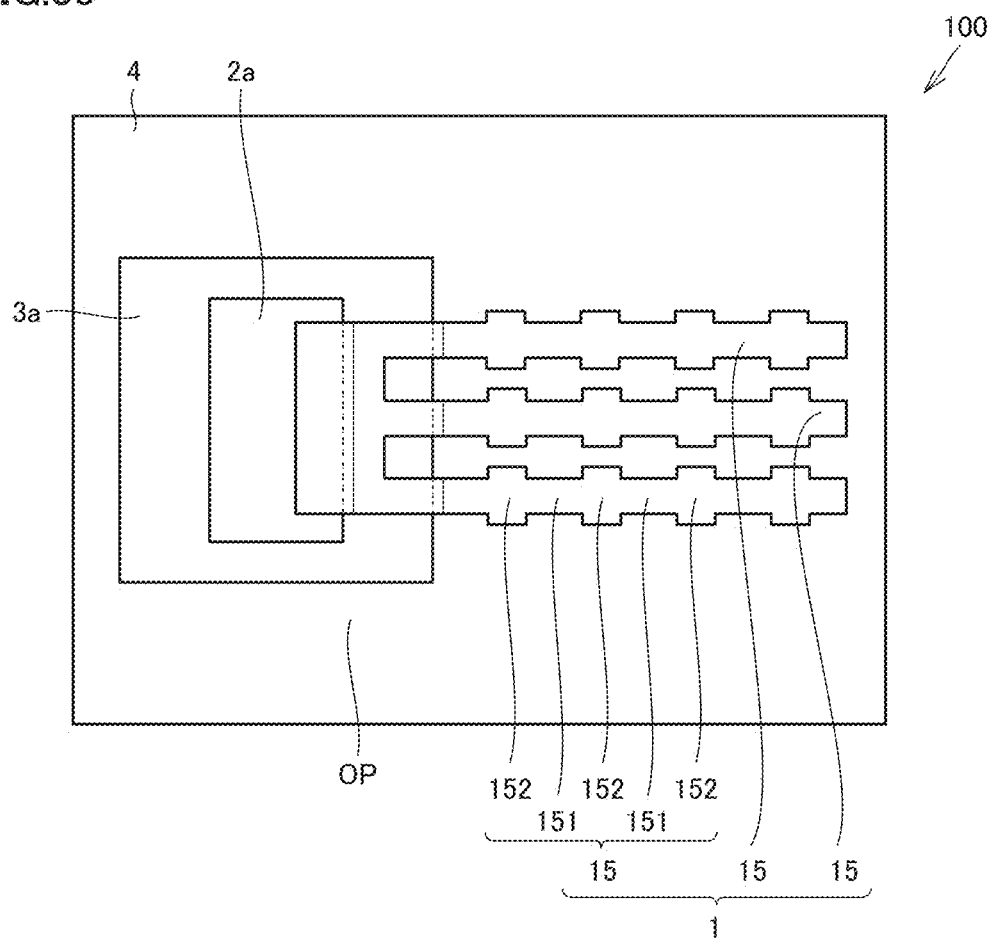
FIG. 38 is a top view schematically showing a configuration of an electromagnetic wave detector according to a second modified example of Embodiment 17.

Next, referring to FIGS. 36 to 38, a configuration of electromagnetic wave detector 100 according to Embodiment 17 is described. Embodiment 17 has the same configuration and operation and effect as Embodiment 1 unless otherwise described. Therefore, the same configuration as that in Embodiment 1 is denoted by the same reference numeral, and description thereof is not repeated.

As shown in FIG. 36, two-dimensional material layer 1 according to the present embodiment includes a pattern of generating plasmon resonance. In the present embodiment, the pattern that generates plasmon resonance is a periodical striped pattern.

Specifically, the two-dimensional material layer includes a plurality of belt-shaped parts 15. Widths d of each of plurality of belt-shaped parts 15 are mutually equivalent. Width d of each of plurality of belt-shaped parts 15 is a dimension along the short direction of each of plurality of belt-shaped parts 15.

Neighboring belt-shaped parts 15 of plurality of belt-shaped parts 15 of two-dimensional material layer 1 are arranged at equivalent intervals spaced apart from each other. That is, plurality of belt-shaped parts 15 of two-dimensional material layer 1 are arranged periodically. A period p of plurality of belt-shaped parts 15 is a sum of width d of each of plurality of belt-shaped parts 15 and an interval between neighboring belt-shaped parts 15.

The plasmon resonance wavelength depends on width d of each of plurality of belt-shaped parts 15, period p of plurality of belt-shaped parts 15, and the Fermi level of two-dimensional material layer 1. Width d of each of plurality of belt-shaped parts 15, and period p of plurality of belt-shaped parts 15 have a relative relationship. For example, when width d of each of plurality of belt-shaped parts 15 is 40 nm, period p of plurality of belt-shaped parts 15 is 50 nm, and a chemical potential is 1.0 eV, the plasmon resonance wavelength is 4 µm.

As shown in FIG. 37, the part that is connected to first electrode 2a of two-dimensional material layer 1 is not necessarily be striped.

As shown in FIG. 38, each of plurality of belt-shaped parts 15 may have a plurality of first belt-shaped parts 151 and a plurality of second belt-shaped parts 152. Each of plurality of first belt-shaped parts 151 and each of plurality of second belt-shaped parts 152 are alternately arranged along the longitudinal direction of plurality of belt-shaped parts 15. Width of each of plurality of second belt-shaped parts 152 is larger than width of each of plurality of first belt-shaped parts 151. In FIG. 38, the shape in a top view of each of plurality of first belt-shaped parts 151 and plurality of second belt-shaped parts 152 is a quadrangle. Therefore, in two-dimensional material layer 1, a quadrangle pattern is formed. Two-dimensional material layer 1 has an asymmetrical shape with respect to the longitudinal direction and the short direction of plurality of belt-shaped parts 15. In other words, two-dimensional material layer 1 has asymmetry in in-plane two dependent directions. Although not illustrated, the shape of plurality of second belt-shaped parts 152 may be a circle, an ellipse, a square, a rectangle and the like. For convenience of description, control electrode 2c (see FIG. 1) is not illustrated in FIG. 38.

Subsequently, operation and effect of the present embodiment is described.

According to electromagnetic wave detector 100 according to Embodiment 17, as shown in FIG. 36, two-dimensional material layer includes a pattern that generates plasmon resonance. The plasmon resonance wavelength depends on width d of each of plurality of belt-shaped parts 15, period p of plurality of belt-shaped parts 15, and the Fermi level of two-dimensional material layer 1. Therefore, electromagnetic wave detector 100 is capable of selectively absorbing light applied to electromagnetic wave detector 100 by resonance absorption according to the plasmon resonance wavelength. Also, electromagnetic wave detector 100 is capable of enhancing and absorbing light applied to electromagnetic wave detector 100 by resonance absorption according to the plasmon resonance wavelength. Accordingly, when light having a plasmon resonance wavelength is applied to electromagnetic wave detector 100, the electric field is enhanced on two-dimensional material layer 1. In this manner, the photoelectric conversion efficiency in semiconductor layer 4 being in contact with two-dimensional material layer 1 is enhanced. Therefore, it is possible to selectively enhance the sensitivity of electromagnetic wave detector 100 in the resonance wavelength.

By adjusting width d and period p of plurality of belt-shaped parts 15, it is possible to fix the plasmon resonance wavelength. Further, by adjusting the chemical potential of two-dimensional material layer 1 by the control electrode, it is possible to electrically change the plasmon resonance wavelength. Therefore, it is possible to electrically control the selective detection wavelength.

As shown in FIG. 38, each of plurality of belt-shaped parts 15 may have plurality of first belt-shaped parts 151 and plurality of second belt-shaped parts 152. Width of each of plurality of second belt-shaped parts 152 is larger than width of each of plurality of first belt-shaped parts 151. In this case, two-dimensional material layer 1 has an asymmetrical shape with respect to the longitudinal direction and the short direction of plurality of belt-shaped parts 15. Owing to asymmetry of two-dimensional material layer 1, asymmetry arises also in plasmon resonance. Therefore, it is possible to selectively detect polarization. When polarization can be selectively detected, it is possible to apply electromagnetic wave detector 100 for polarization imaging or the like.

It is to be understood that the embodiments disclosed herein are illustrative, but are not restrictive in every respect. The scope of the present disclosure is indicated by the appended claims rather than by the description described above, and it is intended that all modifications within the equivalent meaning and scope of the claims are included.

REFERENCE SIGNS LIST

1: two-dimensional material layer, 1a: first part, 1b: second part, 2a: first electrode, 2aa: first side part, 2ab: second side part, 2b: second electrode, 2c: control electrode, 2c0: control electrode part, 2c1: first control electrode part, 2c2: second control electrode part, 3a: first insulating film, 3a1: taper part, 3b: second insulating film, 4: semiconductor layer, 5: buffer layer, 6: connection conductor, 8: contact layer, 11: first end part, 12: second end part, 41: first semiconductor part, 42: second semiconductor part, 100: electromagnetic wave detector, 200: electromagnetic wave detector assembly, DR1: first direction, DR2: second direction, GAP: gap, OP: opening

The invention claimed is:

1. An electromagnetic wave detector comprising:
   a semiconductor layer;
   a first insulating film arranged on the semiconductor layer, and provided with an opening;
   a first electrode provided on the first insulating film;
   a two-dimensional material layer including a first region electrically connected to the semiconductor layer in the opening and a second region to produce photo-gating effect, the second region being located between the first electrode and the opening, the second region being connected to the semiconductor layer with the first insulating film interposed between the second region and the semiconductor layer, the two-dimensional material layer extending from above the opening to the first insulating film and electrically connected to the first electrode;
   a second electrode electrically connected to the semiconductor layer;
   a second insulating film being in contact with the two-dimensional material layer, and
   a control electrode connected to the two-dimensional material layer with the second insulating film interposed between the control electrode and the two-dimensional material layer.

2. The electromagnetic wave detector according to claim 1, wherein
   the second insulating film and the semiconductor layer sandwich the two-dimensional material layer, and
   the control electrode and the two-dimensional material layer sandwich the second insulating film.

3. The electromagnetic wave detector according to claim 1, to vary a voltage difference between the first electrode and the second electrode.

4. The electromagnetic wave detector according to claim 1, to vary a Fermi level of the two-dimensional material layer by applying a voltage to the two-dimensional material layer by the control electrode.

5. The electromagnetic wave detector according to claim 1, wherein a material of the control electrode is a material in which surface plasmon resonance is generated.

6. The electromagnetic wave detector according to claim 1, wherein
   the control electrode includes a plurality of control electrode parts, and
   neighboring control electrode parts of the plurality of control electrode parts are arranged at such an interval that surface plasmon resonance is generated in each of the plurality of control electrode parts.

7. The electromagnetic wave detector according to claim 6, wherein
the two-dimensional material layer includes a first part directly connected to the semiconductor layer,
the plurality of control electrode parts include a first control electrode part, and
the first control electrode part is connected to the first part with the second insulating film interposed between the first control electrode part and the first part.

8. The electromagnetic wave detector according to claim 6, wherein
the two-dimensional material layer includes a second part arranged on the first insulating film,
the plurality of control electrode parts include a second control electrode part, and
the second control electrode part is connected to the second part with the second insulating film interposed between the second control electrode part and the second part.

9. The electromagnetic wave detector according to claim 1, wherein
the two-dimensional material layer includes a first end part and a second end part opposed to the first end part,
the first electrode includes a first side part, and a second side part, the first side part and the second side part sandwiching the opening,
the first end part is directly connected to the first side part, and
the second end part is directly connected to the second side part.

10. The electromagnetic wave detector according to claim 1, wherein
the two-dimensional material layer includes a first end part and a second end part opposed to the first end part,
the first end part is directly connected to the first electrode, and
the second end part is arranged away from the first electrode.

11. The electromagnetic wave detector according to claim 1, further comprising a buffer layer,
the buffer layer being sandwiched between the semiconductor layer and the two-dimensional material layer.

12. The electromagnetic wave detector according to claim 11, wherein the buffer layer has a thickness capable of forming a tunnel current between the semiconductor layer and the two-dimensional material layer.

13. The electromagnetic wave detector according to claim 1, further comprising a connection conductor,
the two-dimensional material layer being electrically connected to the semiconductor layer with the connection conductor interposed between the two-dimensional material layer and the semiconductor layer.

14. The electromagnetic wave detector according to claim 1, wherein
the semiconductor layer includes a first semiconductor part and a second semiconductor part having a conductive type different from a conductive type of the first semiconductor part, and
the first semiconductor part is joined with the second semiconductor part.

15. The electromagnetic wave detector according to claim 14, wherein the second semiconductor part has an absorption wavelength different from an absorption wavelength of the first semiconductor part.

16. The electromagnetic wave detector according to claim 1, wherein
the opening includes a plurality of opening parts provided spaced apart from each other, and
the two-dimensional material layer is connected to the semiconductor layer in each of the plurality of opening parts.

17. The electromagnetic wave detector according to claim 1, wherein
the first insulating film includes a taper part, and
the taper part to have such a thickness that varies as the taper part approaches the opening from the first electrode.

18. The electromagnetic wave detector according to claim 1, further comprising a contact layer,
the contact layer being arranged to be in contact with one of the two-dimensional material layer and the first electrode.

19. The electromagnetic wave detector according to claim 1, wherein the two-dimensional material layer contains a material selected from the group consisting of graphene, transition metal dichalcogenide, black phosphorus, silicene, graphene nanoribbon, and borophene.

20. The electromagnetic wave detector according to claim 1, wherein the two-dimensional material layer includes a turbostratic structure part.

21. The electromagnetic wave detector according to claim 1, wherein the two-dimensional material layer includes a pattern that generates plasmon resonance.

22. An electromagnetic wave detector assembly, comprising a plurality of the electromagnetic wave detectors according to claim 1,
the plurality of electromagnetic wave detectors being arranged in line along at least one of a first direction and a second direction intersecting the first direction.

23. An electromagnetic wave detector comprising:
a semiconductor layer;
a first insulating film arranged on the semiconductor layer, and provided with an opening;
a two-dimensional material layer that is electrically connected to the semiconductor layer in the opening, the two-dimensional material layer extending from above the opening to the first insulating film;
a first electrode electrically connected to the two-dimensional material layer;
a second electrode electrically connected to the semiconductor layer;
a second insulating film being in contact with the two-dimensional material layer, and
a control electrode connected to the two-dimensional material layer with the second insulating film interposed between the control electrode and the two-dimensional material layer,
wherein
the control electrode and the second electrode sandwich the semiconductor layer,
the second insulating film covers the control electrode, and
the two-dimensional material layer covers the semiconductor layer, the first insulating film and the second insulating film.

24. An electromagnetic wave detector comprising:
a semiconductor layer;
a first insulating film arranged on the semiconductor layer, and provided with an opening;
a two-dimensional material layer that is electrically connected to the semiconductor layer in the opening, the two-dimensional material layer extending from above the opening to the first insulating film;

a first electrode electrically connected to the two-dimensional material layer;
a second electrode electrically connected to the semiconductor layer;
a second insulating film being in contact with the two-dimensional material layer, and
a control electrode connected to the two-dimensional material layer with the second insulating film interposed between the control electrode and the two-dimensional material layer, wherein a gap is provided between the first insulating film and the two-dimensional material layer.

* * * * *